(12) United States Patent
Cheng et al.

(10) Patent No.: US 12,451,462 B2
(45) Date of Patent: Oct. 21, 2025

(54) UNIFIED SEMICONDUCTOR DEVICES HAVING PROCESSOR AND HETEROGENEOUS MEMORIES AND METHODS FOR FORMING THE SAME

(71) Applicant: YANGTZE MEMORY TECHNOLOGIES CO., LTD., Wuhan (CN)

(72) Inventors: Weihua Cheng, Wuhan (CN); Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/135,453

(22) Filed: Apr. 17, 2023

(65) Prior Publication Data

US 2023/0253364 A1    Aug. 10, 2023

Related U.S. Application Data

(63) Continuation of application No. 17/499,134, filed on Oct. 12, 2021, now Pat. No. 11,694,993, which is a
(Continued)

(30) Foreign Application Priority Data

Apr. 15, 2019   (WO) ................ PCT/CN2019/082607
Apr. 30, 2019   (WO) ................ PCT/CN2019/085237
Jul. 24, 2019   (WO) ................ PCT/CN2019/097442

(51) Int. Cl.
H10B 10/00     (2023.01)
H01L 21/78     (2006.01)
(Continued)

(52) U.S. Cl.
CPC .......... *H01L 25/0652* (2013.01); *H01L 21/78* (2013.01); *H01L 24/08* (2013.01);
(Continued)

(58) Field of Classification Search
CPC ..... H01L 25/0652; H01L 21/78; H01L 24/08; H01L 24/80; H01L 25/18; H01L 25/50;
(Continued)

(56) References Cited

U.S. PATENT DOCUMENTS 6,055,655 A    4/2000  Momohara
6,537,801 B1   3/2003  Ida et al.
(Continued)

FOREIGN PATENT DOCUMENTS

CN    1190262 A    8/1998
CN    1542974 A    11/2004
(Continued)

OTHER PUBLICATIONS

Notice of Reasons for Refusal issued in corresponding Japanese Application No. 2022-200466, dated Mar. 5, 2024, 11 pages.
(Continued)

*Primary Examiner* — Moin M Rahman
(74) *Attorney, Agent, or Firm* — BAYES PLLC

(57) ABSTRACT

A semiconductor device in a multi-chip package (MCP) includes a controller, at least one non-volatile memory die including an array of non-volatile memory cells and connected to the controller through wire bonding, and at least one volatile memory die including an array of volatile memory cells and connected to the controller through wire bonding. The controller is configured to control operations of the at least one non-volatile memory die and the at least one volatile memory die.

15 Claims, 23 Drawing Sheets

Related U.S. Application Data continuation of application No. 16/669,450, filed on Oct. 30, 2019, now Pat. No. 11,158,604, which is a continuation of application No. PCT/CN2019/105292, filed on Sep. 11, 2019.

(51) Int. Cl.

| | | |
|---|---|---|
| *H01L 23/00* | (2006.01) | |
| *H01L 25/00* | (2006.01) | |
| *H01L 25/065* | (2023.01) | |
| *H01L 25/18* | (2023.01) | |
| *H10B 12/00* | (2023.01) | |

(52) U.S. Cl.
CPC .............. *H01L 24/80* (2013.01); *H01L 25/18* (2013.01); *H01L 25/50* (2013.01); *H10B 10/18* (2023.02); *H10B 12/50* (2023.02); *H01L 2224/08145* (2013.01); *H01L 2224/80895* (2013.01); *H01L 2224/80896* (2013.01); *H01L 2225/06524* (2013.01)

(58) Field of Classification Search
CPC . H01L 2224/08145; H01L 2224/80895; H01L 2224/80896; H01L 2225/06524; H01L 25/0657; H01L 23/481; H01L 24/09; H01L 24/45; H01L 24/48; H01L 2224/05624; H01L 2224/05647; H01L 2224/05657; H01L 2224/05684; H01L 2224/05686; H01L 2224/09181; H01L 2224/45124; H01L 2224/45139; H01L 2224/45144; H01L 2224/45147; H01L 2224/48091; H01L 2224/48145; H01L 2224/48463; H01L 2224/4847; H01L 2224/80357; H01L 2224/95; H01L 2225/06506; H01L 2225/0651; H01L 2225/06513; H01L 2225/06517; H01L 2225/06562; H01L 2225/06568; H01L 2924/143; H01L 2924/1434; H01L 2924/1436; H01L 2924/181; H01L 23/52; H01L 24/82; H01L 24/97; H01L 2224/08148; H01L 2224/82; H01L 2924/00012; H01L 2924/00014; H01L 24/04; H01L 27/1116; H01L 27/10897; H01L 24/32; H01L 2224/29186; H01L 2224/32145; H01L 25/065; H01L 24/83; H01L 24/29; H01L 24/05; H01L 2224/05644; H01L 2224/83896; H01L 25/16; H01L 27/11; H01L 27/108; H01L 21/185; H01L 24/26; H01L 24/27; H01L 2224/271; H01L 2224/29026; H01L 21/76224; H01L 21/02532; H01L 21/02603; H01L 21/28568; H01L 21/30604; H01L 25/105; H01L 21/30625; H01L 21/6835; H01L 21/31116; H01L 21/3065; H10B 43/27; H10B 43/40; H10B 10/00–18; H10B 12/00–50; H10B 12/05–056; H10B 20/00–10; H10B 20/27–50; G11C 5/025; G11C 11/005; G11C 14/0018; G11C 16/06–3495; G11C 2216/12–30; G11C 11/413–419; G11C 11/41–419; G11C 5/06–10; G11C 11/411–4125; G11C 11/401–4099; G11C 14/0009–0045; G11C 2211/4016; G11C 17/10–126; H10D 84/0193; H10D 84/853; H10D 30/6728; H10D 30/6733; H10D 30/6735; H10D 62/118; H10D 89/931; H10D 64/252; H10D 84/0188; H10D 84/201; H10D 18/60; H10D 62/121; H10D 30/024; H10D 30/62; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 30/673; H10D 30/689; H10D 30/6713; H10D 62/021; H10D 64/015; H10D 30/60; H10D 64/671; H10D 84/0165–0195; H10D 84/85–859; H10D 84/907–994; H02K 15/027; A23B 2/783; A45C 11/003; A61K 40/4218; H10F 77/955; H10H 20/826; B82Y 10/00; B81C 2203/0728; B81C 2203/0735; B81C 2203/0742
See application file for complete search history.

(56) References Cited

U.S. PATENT DOCUMENTS

| | | | |
|---|---|---|---|
| 9,558,945 | B2 | 1/2017 | Fukuzumi et al. |
| 9,691,782 | B1 | 6/2017 | Hwang et al. |
| 9,899,347 | B1* | 2/2018 | Mostovoy ............... H01L 24/48 |
| 9,899,355 | B2* | 2/2018 | Yuan ................... H01L 27/0688 |
| 9,935,087 | B2 | 4/2018 | Zhai et al. |
| 10,283,493 | B1 | 5/2019 | Nishida |
| 2007/0145367 | A1 | 6/2007 | Chen et al. |
| 2008/0155196 | A1 | 6/2008 | Black et al. |
| 2008/0270354 | A1 | 10/2008 | Weissman |
| 2010/0140750 | A1 | 6/2010 | Toms |
| 2010/0295136 | A1 | 11/2010 | Or-Bach et al. |
| 2011/0049694 | A1 | 3/2011 | Chandrasekaran et al. |
| 2011/0101537 | A1 | 5/2011 | Barth et al. |
| 2012/0170345 | A1 | 7/2012 | Choi et al. |
| 2013/0277749 | A1 | 10/2013 | Kura et al. |
| 2014/0108885 | A1 | 4/2014 | Loh et al. |
| 2014/0136754 | A1 | 5/2014 | Hyde et al. |
| 2014/0319694 | A1 | 10/2014 | Graves-Abe et al. |
| 2014/0325249 | A1 | 10/2014 | Toyotaka |
| 2015/0021789 | A1 | 1/2015 | Lin |
| 2015/0340366 | A1 | 11/2015 | Lim et al. |
| 2016/0071591 | A1* | 3/2016 | Hsu .................... G11C 16/0483 |
| | | | 438/239 |
| 2016/0079164 | A1 | 3/2016 | Fukuzum et al. |
| 2016/0148918 | A1* | 5/2016 | Ye ........................... H01L 24/04 |
| | | | 438/107 |
| 2016/0157412 | A1 | 6/2016 | Sauder et al. |
| 2017/0053897 | A1 | 2/2017 | Lai et al. |
| 2017/0110183 | A1* | 4/2017 | Chung ................. G06F 3/0673 |
| 2017/0263620 | A1 | 9/2017 | Lee |
| 2018/0046908 | A1 | 2/2018 | Cox et al. |
| 2018/0137294 | A1 | 5/2018 | Van Antwerpen et al. |
| 2018/0204820 | A1 | 7/2018 | Zhai et al. |
| 2018/0210830 | A1* | 7/2018 | Malladi ............. H01L 25/0652 |
| 2018/0261623 | A1 | 9/2018 | Higashi et al. |
| 2018/0357165 | A1* | 12/2018 | Helmick ............. G06F 12/0246 |
| 2018/0366429 | A1* | 12/2018 | Chiu ..................... H01L 23/5384 |
| 2019/0019756 | A1 | 1/2019 | Yu et al. |
| 2019/0043836 | A1 | 2/2019 | Fastow et al. |
| 2019/0081069 | A1 | 3/2019 | Lu et al. |
| 2019/0123022 | A1 | 4/2019 | Teig et al. |
| 2019/0273090 | A1 | 9/2019 | Fukuzumi et al. |
| 2019/0286570 | A1* | 9/2019 | Miura ................. G06F 12/0246 |
| 2019/0363079 | A1 | 11/2019 | Thei et al. |
| 2020/0135266 | A1 | 4/2020 | Kumar et al. |
| 2021/0143124 | A1 | 5/2021 | Lin et al. |

FOREIGN PATENT DOCUMENTS

| | | |
|---|---|---|
| CN | 101079404 A | 11/2007 |
| CN | 105097019 A | 11/2015 |

(56) References Cited

FOREIGN PATENT DOCUMENTS

| | | |
|---|---|---|
| CN | 105468569 | 4/2016 |
| CN | 107658315 A | 2/2018 |
| CN | 108063097 A | 5/2018 |
| CN | 109148498 A | 1/2019 |
| CN | 109155301 A | 1/2019 |
| CN | 109411473 A | 3/2019 |
| CN | 109545764 A | 3/2019 |
| CN | 110190056 A | 8/2019 |
| CN | 110192269 A | 8/2019 |
| JP | H0992781 A | 4/1997 |
| JP | 2005150478 A | 6/2005 |
| JP | 2007053370 A | 3/2007 |
| JP | 2007318106 A | 12/2007 |
| JP | 2008270354 A | 11/2008 |
| JP | 2009253114 A | 10/2009 |
| JP | 2009277334 A | 11/2009 |
| JP | 2010514080 A | 4/2010 |
| JP | 2010251762 A | 11/2010 |
| JP | 2012054523 A | 3/2012 |
| JP | 2013065393 A | 4/2013 |
| JP | 2015119038 A | 6/2015 |
| JP | 2016035948 A | 3/2016 |
| JP | 2016062901 A | 4/2016 |
| KR | 10-2013-0086109 A | 7/2013 |
| KR | 10-2015-0134494 A | 12/2015 |
| TW | 478314 B | 3/2015 |
| TW | 201804332 A | 2/2018 |
| TW | 201913966 A | 4/2019 |
| TW | 201933578 A | 8/2019 |
| WO | 2016057412 A1 | 4/2016 |
| WO | 2016157412 A1 | 10/2016 |
| WO | 2019052127 A | 3/2019 |
| WO | 2019079625 A1 | 4/2019 |

OTHER PUBLICATIONS

International Search Report issued in corresponding International Application No. PCT/CN2019/105290, mailed Jan. 21, 2020, 5 pages.
Written Opinion of the International Searching Authority issued in corresponding International Application No. PCT/CN2019/105290, mailed Jan. 21, 2020, 6 pages.
International Search Report issued in corresponding International Application No. PCT/CN2019/105292, mailed Jan. 15, 2020, 5 pages.
Written Opinion of the International Searching Authority issued in corresponding International Application No. PCT/CN2019/105292, mailed Jan. 15, 2020, 5 pages.
International Search Report issued in corresponding International Application No. PCT/CN2019/105291, mailed Feb. 6, 2020, 4 pages.
Written Opinion of the International Searching Authority issued in corresponding International Application No. PCT/CN2019/105291, mailed Feb. 6, 2020, 4 pages.
Extended European Search Report issued in corresponding European Application No. 19924862.6, mailed Sep. 1, 2022, 15 pages.
Extended European Search Report issued in corresponding European Application No. 19927108.1, mailed Aug. 18, 2022, 12 pages.
Extended European Search Report issued in corresponding European Application No. 19924773, mailed Sep. 26, 2022, 10 pages.
Notice of Reasons for Refusal issued in corresponding Japanese Application No. 2023-132092, dated Oct. 1, 2024, 9 pages.

* cited by examiner

100

200

300

301

400

401

601

603

605

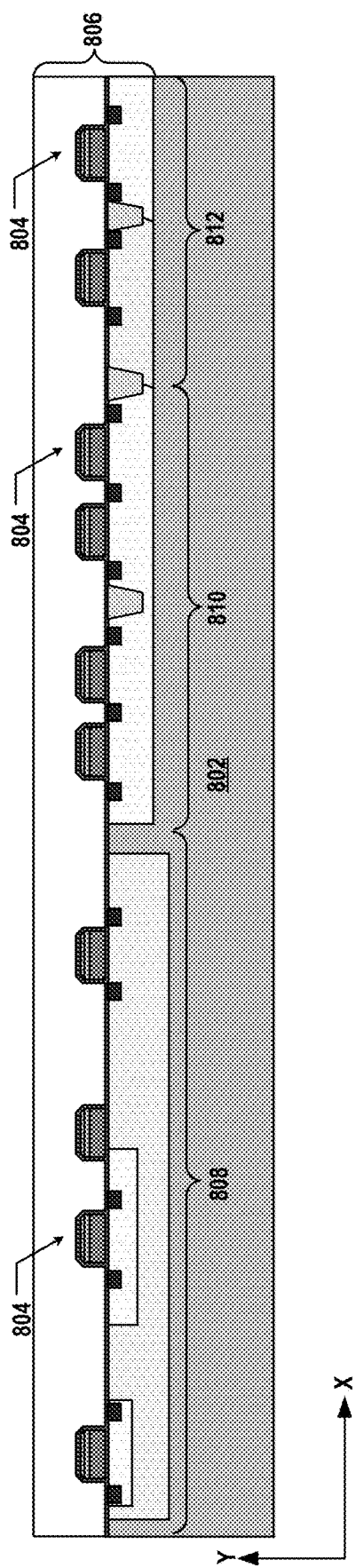
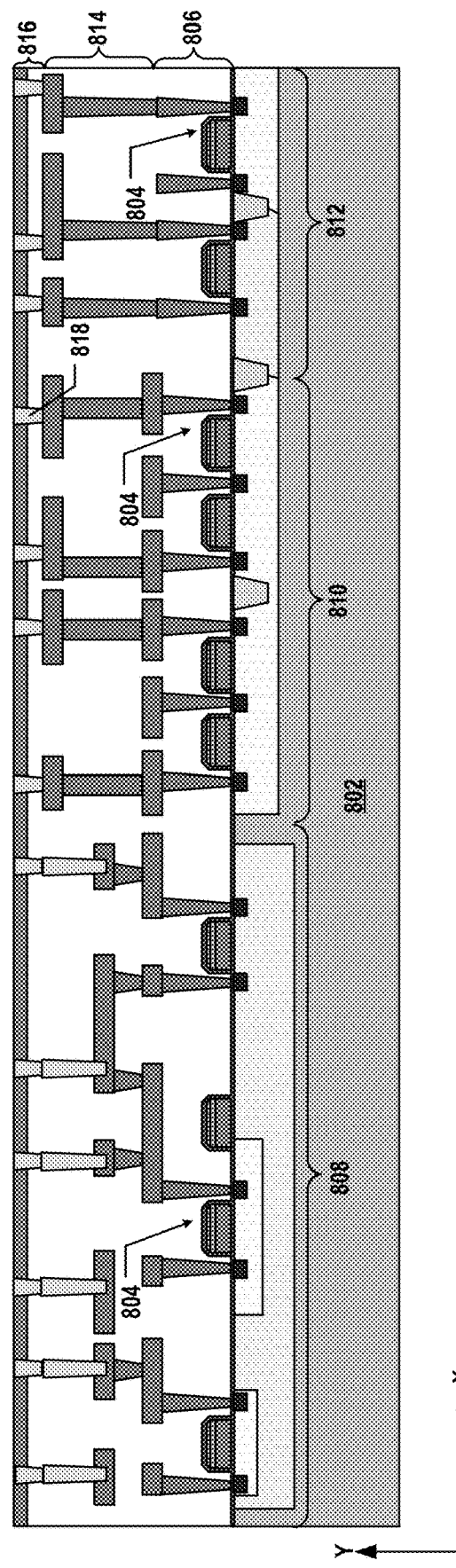
FIG. 8A
FIG. 8B

UNIFIED SEMICONDUCTOR DEVICES HAVING PROCESSOR AND HETEROGENEOUS MEMORIES AND METHODS FOR FORMING THE SAME

CROSS-REFERENCE TO RELATED APPLICATIONS

This application is a continuation of U.S. application Ser. No. 17/499,134, filed on Oct. 12, 2021, which is a continuation of U.S. application Ser. No. 16/669,450, filed on Oct. 30, 2019, which is a continuation of International Application No. PCT/CN2019/105292, filed on Sep. 11, 2019, which claims the benefit of priorities to International Application No. PCT/CN2019/082607, filed on Apr. 15, 2019, International Application No. PCT/CN2019/097442, filed on Jul. 24, 2019, and International Application No. PCT/CN2019/085237, filed on Apr. 30, 2019, all of which are incorporated herein by reference in their entireties. This application is also related to U.S. application Ser. No. 16/669,435, filed on Oct. 30, 2019, and U.S. application Ser. No. 16/669,445, filed on Oct. 30, 2019, both of which are hereby incorporated by reference in their entireties.

BACKGROUND

Embodiments of the present disclosure relate to semiconductor devices and fabrication methods thereof.

In modern mobile devices (e.g., smartphones, tablets, etc.), multiple complicated system-on-chips (SOCs) are used to enable various functionalities, such as application processor, dynamic random-access memory (DRAM), flash memory, various controllers for Bluetooth, Wi-Fi, global positioning system (GPS), frequency modulation (FM) radio, display, etc., and baseband processor, which are formed as discrete chips. For example, application processor typically is large in size including central processing units (CPUs), graphics processing units (GPUs), on-chip memory, accelerating function hardware, and other analog components.

SUMMARY

Embodiments of semiconductor devices and fabrication methods thereof are disclosed herein.

In one example, a semiconductor device includes an array of NAND memory cells and a first bonding layer including a plurality of first bonding contacts. The semiconductor device also includes a second semiconductor structure including an array of DRAM cells and a second bonding layer including a plurality of second bonding contacts. The semiconductor device also includes a third semiconductor structure including a processor, an array of static random-access memory (SRAM) cells, and a third bonding layer including a plurality of third bonding contacts. The semiconductor device further includes a first bonding interface between the first bonding layer and the third bonding layer, and a second bonding interface between the second bonding layer and the third bonding layer. The first bonding contacts are in contact with a first set of the third bonding contacts at the first bonding interface. The second bonding contacts are in contact with a second set of the third bonding contacts at the second bonding interface. The first bonding interface and the second bonding interface are in a same plane.

In another example, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a processor, an array of SRAM cells, and a third bonding layer including a plurality of third bonding contacts. The third wafer is diced into a plurality of third dies, such that at least one of the third dies includes the at least one of the third semiconductor structures. The third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface.

In still another example, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a processor, an array of SRAM cells, and a third bonding layer including a plurality of third bonding contacts. The third wafer and each of the at least one first die and the at least one second die are bonded in a face-to-face manner to form a bonded structure, such that the at least one third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface. The bonded structure is diced into a plurality of dies. At least one of the dies includes the bonded first, second, and third semiconductor structures.

In yet another example, a semiconductor device in a multi-chip package (MCP) includes a circuit board, a hybrid controller on the circuit board, at least one NAND die, and at least one DRAM die. The at least one NAND die includes an array of NAND memory cells and is electrically connected to the hybrid controller through die-to-die wire bonding. The at least one DRAM die includes an array of DRAM cells and is electrically connected to the hybrid controller through die-to-die wire bonding. The hybrid controller is configured to control data transfer between the at least one NAND die and the at least one DRAM die.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 8A and 8B illustrate a fabrication process for forming an exemplary semiconductor structure having a processor, SRAM, and peripheral circuits, according to some embodiments.

Figure 1:
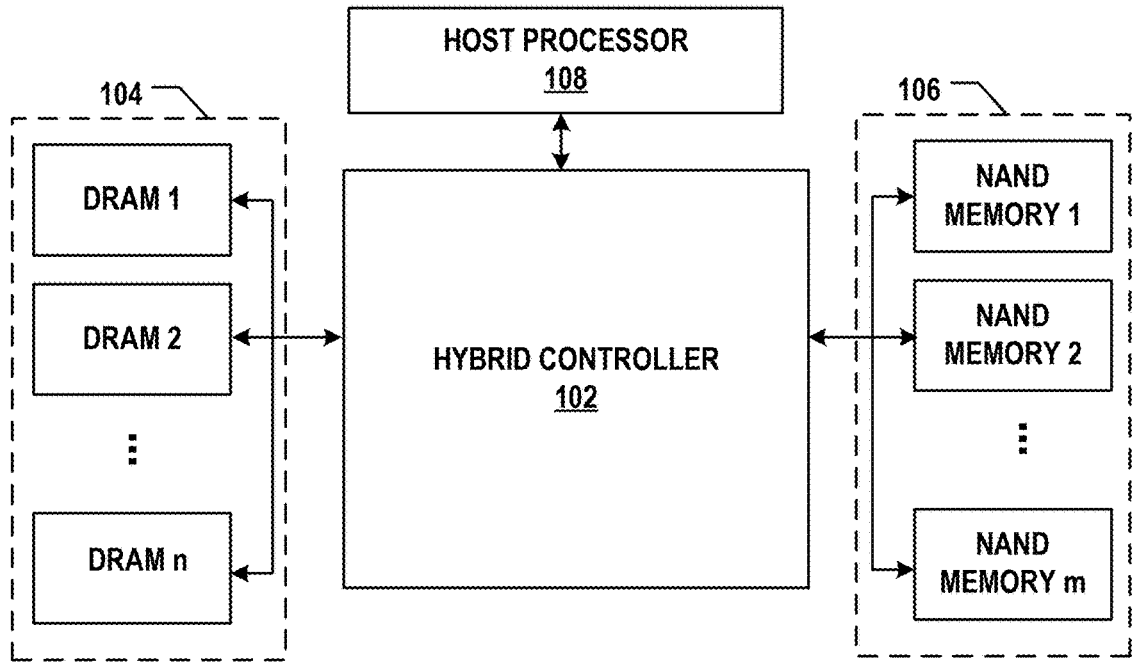
FIG. 1 illustrates a block diagram of an exemplary system having heterogeneous memories and a hybrid controller, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to affect such features, structures or characteristics in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, a "wafer" is a piece of a semiconductor material for semiconductor devices to build in and/or on it and that can undergo various fabrication processes before being separated into dies.

The conventional way of using embedded NAND memory (also known as "NAND flash memory") products as non-volatile memory/storage, such as embedded multimedia card (eMMC), universal flash storage (UFS), and ball grid array (BGA) solid-state drive (SSD), etc. includes soldering the NAND memory chips onto a printed circuit board (PCB). Control lines and data transfer lines of the corresponding protocols of all memory devices are derived from the host processor (also known as "microprocessor," e.g., CPU). The conventional method, however, can introduce cross-talk between the control and data transfer lines and also cause high loading on the processor.

Moreover, the conventional memory is usually homogeneous, i.e., having the same type of memories. For example, the main memory is either NAND memory or DRAM. Even for a memory device in an MCP, the same types of memory dies, e.g., NAND dies or DRAM dies, are included in the same package. However, when different types of memories are needed, multiple memory chips (in separate packages) soldered onto a PCB and electrically connected through long-distance metal wires/lines on the PCB are necessary, thereby causing further RC delay and increasing PCB area.

On the other hand, as modern processors developed into more advanced generations, the cache size is playing an incrementally important role for processor performance enhancement. In some cases, cache occupied half or even more chip real estate in a microprocessor chip. Also, the resistive-capacitive (RC) delay from the cache to the processor core logic could become significant to degrade performance. Moreover, a bus interface unit is needed to electrically connect the processor to external non-volatile memory. The bus interface unit itself, however, occupies additional chip area, and its electrical connections to the non-volatile memory and/or volatile memory need additional area for metal routing and introduce additional RC delay.

Various embodiments in accordance with the present disclosure provide a unified semiconductor device with a processor core, cache, and heterogeneous memories (e.g., DRAM and NAND memories) integrated in an MCP or even on the same bonded chip to achieve better data storage performance, such as faster data processing, transfer, and storage speed, higher efficiency, and higher data storage capacity. The heterogeneous memory architecture can utilize the advantages of both non-volatile memory and volatile memory, for example, the large storage capacity of NAND memory and the fast access speed of DRAM, thereby broadening the process window for circuit design. In one example, the heterogeneous memory architecture can achieve faster power-on speed by reloading the logical-physical address map from each NAND memory to a respective DRAM when the system restarts due to power interruption.

In one example, the semiconductor device disclosed herein can be in an MCP having a hybrid controller and multiple NAND dies and DRAM dies controlled by the hybrid controller. In another example, the semiconductor device disclosed herein can include heterogeneous memories, such as a first semiconductor structure having NAND memory (e.g., as non-volatile memory), and a second semiconductor structure having DRAM (e.g., as volatile memory). The semiconductor device disclosed herein can further include a third semiconductor structure having a processor core (e.g., as the controller of the heterogeneous memories) and SRAM (e.g., as cache) bonded to each of the first and second semiconductor structures with a large number of short-distance vertical metal interconnects instead of the peripherally-distributed, long-distance metal routing, or even conventional through silicon vias (TSVs). Bus interface units can also be significantly reduced or even completely removed. In some embodiments, the cache module can be divided into smaller cache regions, distributing randomly according to bonding contact design.

As a result, the optimal instant data and state storage capability can achieve higher signal-to-noise (S/N) ratio, better memory array efficiency, less die size and lower bit cost, denser arrangements of functional modules (e.g. processor core, cache, bus interface, etc.), faster speed, and smaller PCB size at the same time. Further, shorter manufacturing cycle time with higher yield can be achieved due to less interactive influences from manufacturing processes of the processor wafer, the NAND memory wafer, and the DRAM wafer, as well as the known good hybrid bonding yield. The shorter connection distance between the processor, NAND memory, and DRAM, such as from millimeter or centimeter-level to micrometer-level, can improve the processor and memory performance with faster data transfer rate, improve processor core logic efficiency with wider bandwidth, and improve system speed.

FIG. 1 illustrates a block diagram of an exemplary system 100 having heterogeneous memories and a hybrid controller, according to some embodiments. System 100 can be any suitable system that includes a memory, such as an SSD, an eMMC, or a UFS. In some embodiments, system 100 includes a hybrid controller 102, heterogeneous memories including one or more DRAMs 104 and one or more NAND memories 106, and a host processor 108. Different from conventional homogenous memory systems, which include a single memory, system 100 can include multiple pairs of heterogeneous memories, such as a pair of DRAM 104 and NAND memory 106.

Hybrid controller 102 can be configured to control operations of DRAMs 104 and NAND memories 106. That is, hybrid controller 102 can act as both a NAND memory controller managing data storage and transfer in NAND memories 106 and a DRAM controller managing data storage and transfer in DRAMs 104. In some embodiments, Hybrid controller 102 is configured to control data transfer between DRAMs 104 and NAND memories 106. For example, each NAND memory 106 may be configured to store a logical-physical address map, and hybrid controller 102 may be configured to load the logical-physical address map from each NAND memory 106 to respective DRAM 104 when system 100 is powered on. A logical address is the address generated by the CPU during execution, and a physical address is the location in a memory. A logical-physical address map can map a physical address to a logical address.

Host processor 108 can include one or more integrated or discrete processor cores, such as execution logic/engines configured to perform any suitable logic operations. In some embodiments, host processor 108 also includes one or more caches (e.g., instruction cache or data cache) formed by SRAM. It is understood that hybrid controller 102 may also include a cache formed by SRAM in some embodiments. In some embodiments, the cache (in host processor 108 and/or hybrid controller 102) is configured to store a log of updates to the logical-physical address map. That is, any updates to the logical-physical address map during the operation of system 100 (i.e., when system 100 is power on) can be stored in the cache in host processor 108 and/or hybrid controller 102. By storing the log of updates to the logical-physical address map in the cache, the logical-physical address map can be securely saved without a large and expensive uninterruptible power supply (UPS). For example, in case an unexpected power disruption occurs, hybrid controller 102 may reload the logical-physical address map from each NAND memory 106 to respective DRAM 104 without affecting the reboot speed when the power resumes. In some embodiments, each of hybrid controller 102 and host processor 108 further includes one or more bus interface units (not shown) configured to receive and transmit data within system 100 and between system 100 and other devices.

Figure 2:
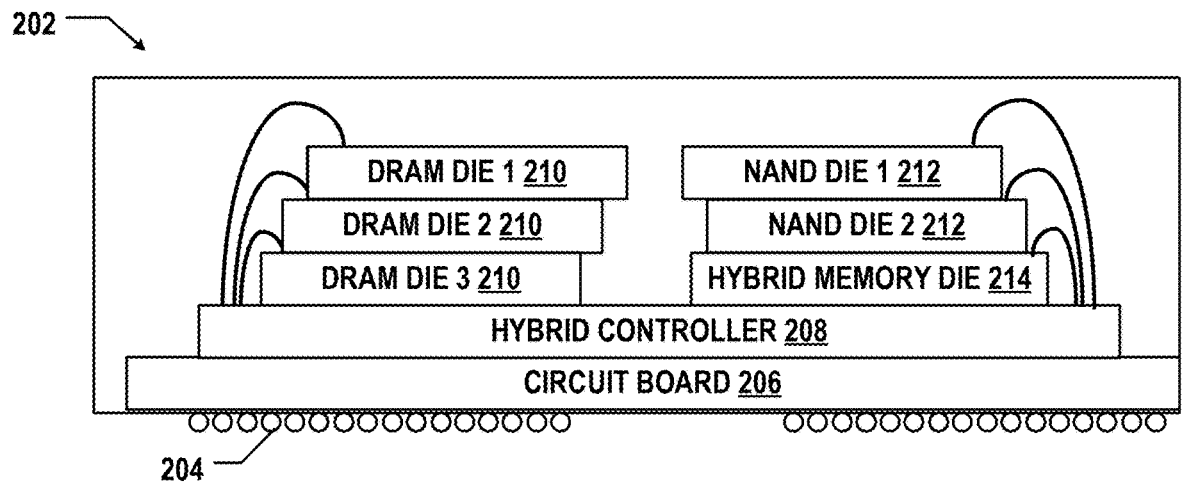
FIG. 2 illustrates a schematic view of a cross-section of an exemplary semiconductor device in an MCP having heterogeneous memories and a hybrid controller, according to some embodiments.

FIG. 2 illustrates a schematic view of a cross-section of an exemplary semiconductor device 200 in an MCP 202 having heterogeneous memories and a hybrid controller, according to some embodiments. MCP 202, also known as multi-chip module (MCM), is an electronic assembly, such as a package with a number of conductor terminals (i.e., pins) 204 where multiple integrated circuits (ICs or "chips"), semiconductor dies, and/or other discrete components are integrated onto a circuit board 206, according to some embodiments as shown in FIG. 2. In some embodiments, a variety of chiplets are stacked on circuit board 206 in MCP 202, including a hybrid controller 208 on circuit board 206, one or more DRAM dies 210, one or more NAND dies 212, and one or more hybrid memory dies 214. Each of the memory dies, e.g., DRAM die 210, NAND die 212, and hybrid memory die 214, is electrically connected to hybrid controller 208 through die-to-die wire bonding including, but not limited to, aluminum (Al), copper (Cu), silver (Ag), or gold (Au) bonding wires based on ball bonding, wedge bonding, or compliant bonding.

Hybrid controller 208 can be an example of hybrid controller 102 described above in detail with respect to FIG. 1. As described below in detail, each DRAM die 210 can include an array of DRAM cells, and each NAND die 212 can include an array of NAND memory cells, for example, an array of 3D NAND memory strings and/or an array of two-dimensional (2D) NAND memory cells. Each DRAM die 210 can be an exemplary implementation of DRAM 104, and each NAND die 212 can be an exemplary implementation of NAND memory 106, described above in detail with respect to FIG. 1. Hybrid memory die 214 includes an array of NAND memory cells and an array of DRAM cells, according to some embodiments. That is, semiconductor device 200 not only includes heterogeneous memory dies, such as both DRAM dies 210 and NAND dies 212 in same MCP 202, but may also include heterogeneous memory cells, such as both DRAM and NAND memory cells, on same hybrid memory die 214 in some embodiments.

Figure 3A:
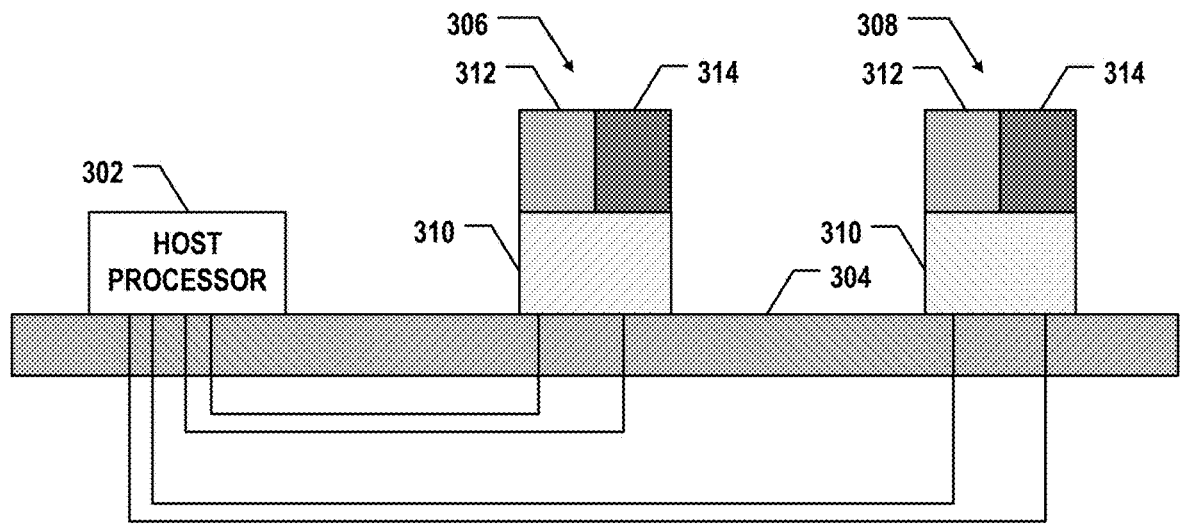
FIG. 3A illustrates a schematic view of a cross-section of an exemplary system having a host processor and bonded semiconductor devices each having heterogeneous memories, according to some embodiments.

FIG. 3A illustrates a schematic view of a cross-section of an exemplary system 300 having a host processor 302 and bonded semiconductor devices each having heterogeneous memories, according to some embodiments. System 300 can be any suitable system that includes a memory, such as an SSD, an eMMC, or a UFS. System 300 includes host processor 302 attached (e.g., soldered) onto a PCB 304, according to some embodiments. Host processor 302 can be an example of host processor 108 described above in detail with respect to FIG. 1. System 300 can further include a plurality of bonded semiconductor devices 306 and 308 each attached (e.g., soldered) onto PCB 304 as well. Each bonded semiconductor device 306 or 308 can be an embedded heterogeneous memory device electrically connected to host processor 302 directly through a control line for transferring embedded control signals and a data transfer line for transferring embedded data signals. That is, host processor 302 can control the operations of each bonded semiconductor device 306 or 308 and exchange data with each bonded semiconductor device 306 or 308 directly through host lines.

As illustrated in FIG. 3A, each bonded semiconductor device 306 or 308 is a unified semiconductor device including a first semiconductor structure 312 having NAND memory, a second semiconductor structure 314 having DRAM, and a third semiconductor structure 310 having a processor. The processor of third semiconductor structure 310 can be an exemplary implementation of hybrid controller 102 described above in detail with respect to FIG. 1. The NAND memory and DRAM of first and second semiconductor structures 312 and 314 can be a pair of heterogeneous memories as an exemplary implementation of NAND memory 106 and DRAM 104 described above in detail with respect to FIG. 1. Each of first and second semiconductor structures 312 and 314 is jointed with third semiconductor structure 310 vertically in a 3D arrangement as described below in detail, according to some embodiments. That is, each of first and second semiconductor structures 312 and 314 can be stacked over third semiconductor structure 310. As a result, the electrical connections between the processor, NAND memory, and DRAM can be shortened, the RC delay can be reduced, and the PCB area can be saved.

Figure 3B:
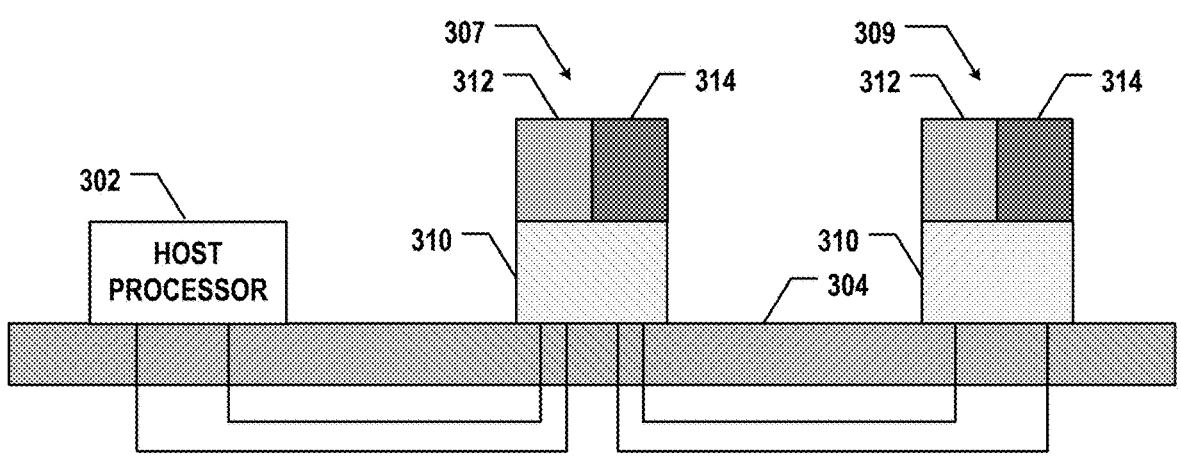
FIG. 3B illustrates a schematic view of a cross-section of another exemplary system having a host processor and bonded semiconductor devices each having heterogeneous memories, according to some embodiments.

FIG. 3B illustrates a schematic view of a cross-section of another exemplary system 301 having host processor 302 and bonded semiconductor devices each having heterogeneous memories, according to some embodiments. System 301 is the same as system 300 in FIG. 3A except that a bonded semiconductor device 309 does not interact with host processor 302 directly. The control line and data transfer line of bonded semiconductor device 309 are not derived from host processor 302. Instead, bonded semiconductor device 309 is electrically connected to another bonded semiconductor device 307 through a control line and a data transfer line. The processor in third semiconductor structure 310 of bonded semiconductor device 307 can share at least some functions of host processor 302, for example, controlling the operations of bonded semiconductor device 309 and exchange data with bonded semiconductor device 309. In some embodiments, bonded semiconductor device 307, acting as a "bridge," can relay the control signals and/or data signals from host processor 302 to bonded semiconductor device 309. In any event, bonded semiconductor device 307 can reduce the loading on host processor 302 and the cross-talk between the host lines (e.g., the control and data transfer lines derived from host processor 302).

Figure 4A:
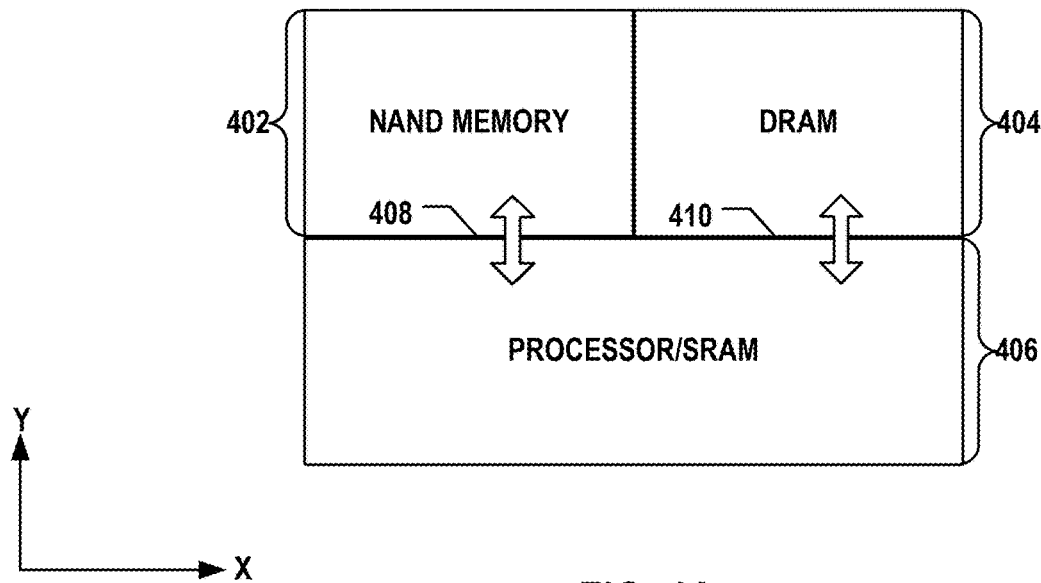
FIG. 4A illustrates a schematic view of a cross-section of an exemplary semiconductor device having heterogeneous memories, according to some embodiments.

FIG. 4A illustrates a schematic view of a cross-section of an exemplary semiconductor device 400 having heterogeneous memories, according to some embodiments. Semiconductor device 400 represents an example of bonded semiconductor devices 306, 307, 308, and 309 in FIGS. 3A and 3B. The components of semiconductor device 400 (e.g., processors/SRAM, NAND memory, and DRAM) can be formed separately on different substrates and then jointed together to form a bonded chip.

Semiconductor device 400 can include a first semiconductor structure 402 including an array of NAND memory cells. That is, first semiconductor structure 402 can be a NAND flash memory device in which memory cells are provided in the form of an array of 3D NAND memory strings and/or an array of 2D NAND memory cells. NAND memory cells can be organized into pages which are then organized into blocks in which each NAND memory cell is electrically connected to a separate line called a bit line (BL). All memory cells with the same vertical position in the NAND memory cell can be electrically connected through the control gates by a word line (WL). In some embodiments, a memory plane contains a certain number of blocks that are electrically connected through the same bit line.

In some embodiments, the array of NAND memory cells is an array of 2D NAND memory cells, each of which includes floating-gate transistors. The array of 2D NAND memory cells includes a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells are an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor Semiconductor device 400 can also include a second semiconductor structure 404 including an array of DRAM cells. That is, second semiconductor structure 404 can be a DRAM memory device. DRAM requires periodic refreshing of the memory cells. In some embodiments, each DRAM cell includes a capacitor for storing a bit of data as a positive or negative electrical charge as well as one or more transistors that control access to it. In one example, each DRAM cell is a one-transistor, one-capacitor (1T1C) cell.

Semiconductor device 400 can further include a third semiconductor structure 406 including a processor and an array of SRAM cells. In some embodiments, the processor and SRAM cell array in third semiconductor structure 406 use complementary metal-oxide-semiconductor (CMOS) technology. Both the processor and the SRAM cell array can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed.

The processor can include a specialized processor including, but not limited to, CPU, GPU, digital signal processor (DSP), tensor processing unit (TPU), vision processing unit (VPU), neural processing unit (NPU), synergistic processing unit (SPU), physics processing unit (PPU), and image signal processor (ISP). The processor can also include a SoC that combines multiple specialized processors, such as an application processor, baseband processor, and so on. In some embodiments in which semiconductor device 400 is used in mobile devices (e.g., smartphones, tablets, eyeglasses, wrist watches, virtual reality/augmented reality headsets, laptop computers, etc.), an application processor handles applications running in an operating system environment, and a baseband processor handles the cellular communications, such as the second-generation (2G), the third-generation (3G), the fourth-generation (4G), the fifth-generation (5G), the sixth-generation (6G) cellular communications, and so on. In some embodiments, the processor in third semiconductor structure 406 is or includes an example of hybrid controller 102 described above in detail with respect to FIG. 1.

Other processing units (also known as "logic circuits") besides the processor can be formed in third semiconductor structure 406 as well, such as the entirety or part of the peripheral circuits of the NAND memory in first semiconductor structure 402 and/or the entirety or part of the peripheral circuits of DRAM in second semiconductor structure 404. In some embodiments, third semiconductor structure 406 of semiconductor device 400 further includes the entirety or part the peripheral circuits of the NAND memory in first semiconductor structure 402. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, third semiconductor structure 406 of semiconductor device 400 further includes the entirety or part the peripheral circuits of the DRAM in second semiconductor structure 404. The peripheral circuits (also known as control and sensing circuits) can include any suitable digital, analog, and/or mixed-signal circuits used for facilitating the operations of the DRAM. For example, the peripheral circuits can include one or more of an input/output buffer, a decoder (e.g., a row decoder and a column decoder), a sense amplifier, or any active or passive components of the circuit (e.g., transistors, diodes, resistors, or capacitors). In some embodiments, first semiconductor structure 402 includes the entirety or part of the peripheral circuits of the NAND memory, and second semiconductor structure 404 includes the entirety or part of the peripheral circuits of the DRAM.

The SRAM is integrated on the same substrate of the logic circuits (e.g., the processor and peripheral circuits), allowing wider bus and higher operation speed, which is also known as "on-die SRAM." The memory controller of the SRAM can be embedded as part of the peripheral circuits. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM cells can locate in the area that is not occupied by the logic circuits (e.g., the processor and peripheral circuits) and thus, do not need extra space to be formed. The on-die SRAM can enable high-speed operations of semiconductor device 400, used as one or more caches (e.g., instruction cache or data cache) and/or data buffers.

As shown in FIG. 4A, semiconductor device 400 further includes a first bonding interface 408 vertically between first semiconductor structure 402 and third semiconductor structure 406, and a second bonding interface 410 vertically between second semiconductor structure 404 and third semiconductor structure 406. First bonding interface 408 and second bonding interface 410 are in the same plane, according to some embodiments. That is, in some embodiments, first semiconductor structure 402 and second semiconductor structure 404 are not stacked over one another, but instead, both are stacked over and in contact with third semiconductor structure 406. Third semiconductor structure 406 can have a size larger than the size of first or second semiconductor structure 402 or 404 to accommodate both first and second semiconductor structures 402 and 404.

As described below in detail, first, second, and third semiconductor structures 402, 404, and 406 can be fabricated separately (and in parallel in some embodiments) such that the thermal budget of fabricating one of first, second, and third semiconductor structures 402, 404, and 406 does not limit the processes of fabricating another one of first, second, and third semiconductor structures 402, 404, and 406. Moreover, a large number of interconnects (e.g., bonding contacts) can be formed through first and second bonding interfaces 408 and 410 to make direct, short-distance (e.g., micron-level) electrical connections between first and third semiconductor structures 402 and 406 and between second and third semiconductor structures 404 and 406, respectively, as opposed to the long-distance (e.g., millimeter or centimeter-level) chip-to-chip data bus on the circuit board, such as PCB, thereby eliminating chip interface delay and achieving high-speed I/O throughput with reduced power consumption. Data transfer between the NAND memory in first semiconductor structure 402 and the processor in third semiconductor structure 406 as well as between the NAND memory in first semiconductor structure 402 and the SRAM in third semiconductor structure 406 can be performed through the interconnects (e.g., bonding contacts) across first bonding interface 408. Similarly, data transfer between the DRAM in second semiconductor structure 404 and the processor in third semiconductor structure 406 as well as between the DRAM in second semiconductor structure 404 and the SRAM in third semiconductor structure 406 can be performed through the interconnects (e.g., bonding contacts) across second bonding interface 410. By vertically integrating first, second, and third semiconductor structures 402, 404, and 406, the chip size can be reduced, and the memory cell density can be increased. Furthermore, as a "unified" chip, by integrating multiple discrete chips (e.g., various processors, controllers, and heterogeneous memories) into a single bonded chip (e.g., semiconductor device 400), faster system speed and smaller PCB size can be achieved as well.

Figure 4B:
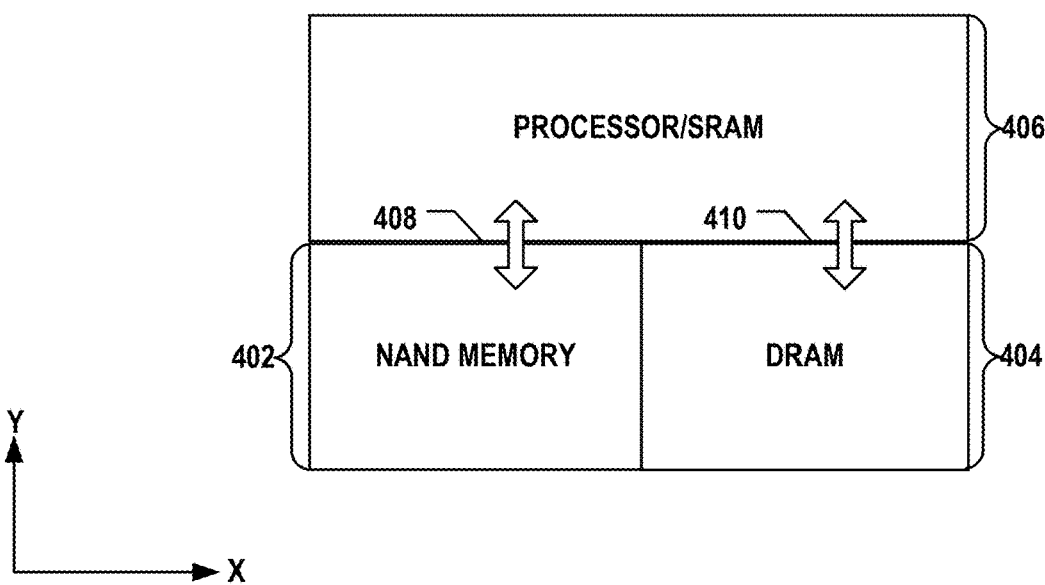
FIG. 4B illustrates a schematic view of a cross-section of another exemplary semiconductor device having heterogeneous memories, according to some embodiments.

It is understood that the relative positions of stacked first, second, and third semiconductor structures 402, 404, and 406 are not limited. FIG. 4B illustrates a schematic view of a cross-section of another exemplary semiconductor device 401, according to some embodiments. Different from semiconductor device 400 in FIG. 4A in which third semiconductor structure 406 including the processor and array of SRAM cells is below first semiconductor structure 402 including the array of NAND memory cells and second semiconductor structure 404 including the array of DRAM cells, in semiconductor device 401 in FIG. 4B, third semiconductor structure 406 is above first semiconductor structure 402 and second semiconductor structure 404. Nevertheless, first bonding interface 408 is formed vertically between first and third semiconductor structures 402 and 406 in semiconductor device 401, and first and third semiconductor structures 402 and 406 are jointed vertically through bonding (e.g., hybrid bonding) according to some embodiments. Similarly, second bonding interface 410 is formed vertically between second and third semiconductor structures 404 and 406 in semiconductor device 401, and second and third semiconductor structures 404 and 406 are jointed vertically through bonding (e.g., hybrid bonding) according to some embodiments. Data transfer between the NAND memory in first semiconductor structure 402 and the processor in third semiconductor structure 406, as well as the data transfer between the NAND memory in first semiconductor structure 402 and the SRAM in third semiconductor structure 406 can be performed through the interconnects (e.g., bonding contacts) across first bonding interface 408. Similarly, data transfer between the DRAM in second semiconductor structure 404 and the processor in third semiconductor structure 406 as well as the data transfer between the DRAM in second semiconductor structure 404 and the SRAM in third semiconductor structure 406 can be performed through the interconnects (e.g., bonding contacts) across second bonding interface 410.

Figure 5A:
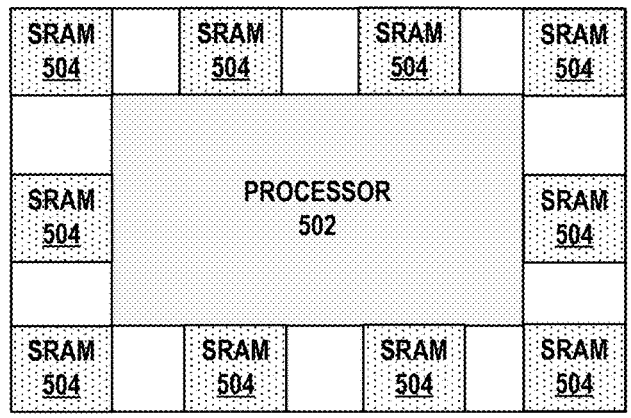
FIG. 5A illustrates a schematic plan view of an exemplary semiconductor structure having a processor and SRAM, according to some embodiments.

FIG. 5A illustrates a schematic plan view of an exemplary semiconductor structure 501 having a processor and SRAM, according to some embodiments. Semiconductor structure 501 may be one example of third semiconductor structure 406 in FIGS. 4A and 4B. Semiconductor structure 501 can include a processor 502 on the same substrate as SRAM 504 and fabricated using the same logic process as SRAM 504. Processor 502 can include one or more of CPUs, GPUs, DSPs, application processors, baseband processors, to name a few. SRAM 504 can be disposed outside of processor 502. For example, FIG. 5A shows an exemplary layout of SRAM 504 in which the array of SRAM cells is distributed in a plurality of separate regions in semiconductor structure 501, which is outside of processor 502. That is, the cache module formed by SRAM 504 can be divided into smaller cache regions, distributing outside of processor 502 in semiconductor structure 501. In one example, the distribution of the cache regions may be based on the design of the bonding contacts, e.g., occupying the areas without bonding contacts. In another example, the distribution of the cache regions may be random. As a result, more internal cache (e.g., using on-die SRAM) can be arranged surrounding processor 502 without occupying additional chip area.

Figure 5B:
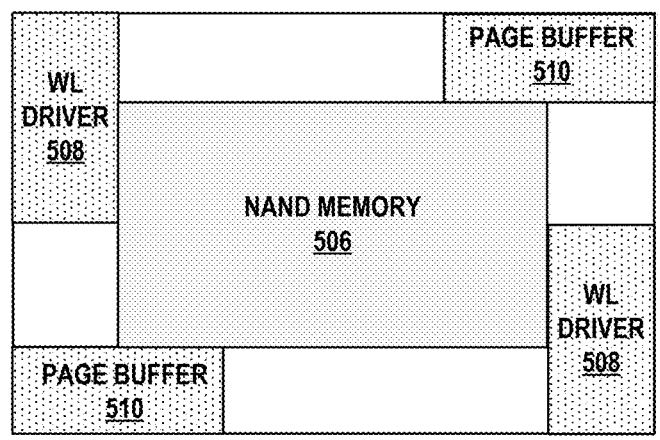
FIG. 5B illustrates a schematic plan view of an exemplary semiconductor structure having NAND memory and peripheral circuits, according to some embodiments.

FIG. 5B illustrates a schematic plan view of an exemplary semiconductor structure 503 having NAND memory and peripheral circuits, according to some embodiments. Semiconductor structure 503 may be one example of first semiconductor structure 402 in FIGS. 4A and 4B. Semiconductor structure 503 can include NAND memory 506 on the same substrate as the peripheral circuits of NAND memory 506. Semiconductor structure 503 can include all the peripheral circuits for controlling and sensing NAND memory 506, including, for example, word line drivers 508, page buffers 510, and any other suitable devices. FIG. 5B shows an exemplary layout of the peripheral circuit (e.g., word line drivers 508, page buffers 510) and NAND memory 506 in which the peripheral circuit (e.g., word line drivers 508, page buffers 510) and NAND memory 506 are formed in different regions on the same plane. For example, the peripheral circuit (e.g., word line drivers 508, page buffers 510) may be formed outside NAND memory 506.

Figure 5C:
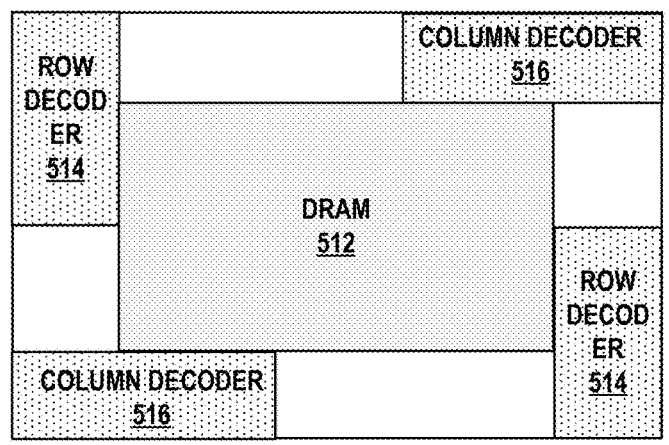
FIG. 5C illustrates a schematic plan view of an exemplary semiconductor structure having DRAM and peripheral circuits, according to some embodiments.

FIG. 5C illustrates a schematic plan view of an exemplary semiconductor structure 505 having DRAM and peripheral circuits, according to some embodiments. Semiconductor structure 505 may be one example of second semiconductor structure 404 in FIGS. 4A and 4B. Semiconductor structure 505 can include DRAM 512 on the same substrate as the peripheral circuits of DRAM 512. Semiconductor structure 505 can include all the peripheral circuits for controlling and sensing DRAM 512, including, for example, row decoders 514, column decoders 516, and any other suitable devices. FIG. 5C shows an exemplary layout of the peripheral circuit (e.g., row decoders 514, column decoders 516) and DRAM 512 in which the peripheral circuit (e.g., row decoders 514, column decoders 516) and DRAM 512 are formed in different regions on the same plane. For example, the peripheral circuit (e.g., row decoders 514, column decoders 516) may be formed outside of DRAM 512.

It is understood that the layouts of semiconductor structures 501, 503, and 505 are not limited to the exemplary layouts in FIGS. 5A-5C. In some embodiments, part of the peripheral circuits of NAND memory 506 (e.g., one or more of word line drivers 508, page buffers 510, and any other suitable devices) may be in semiconductor structure 501 having processor 502 and SRAM 504. That is, the peripheral circuits of NAND memory 506 may be distributed on both semiconductor structures 501 and 503, according to some other embodiments. In some embodiments, part of the peripheral circuits of DRAM 512 (e.g., one or more of row decoders 514, column decoders 516, and any other suitable devices) may be in semiconductor structure 501 having processor 502 and SRAM 504. That is, the peripheral circuits of DRAM 512 may be distributed on both semiconductor structures 501 and 505, according to some other embodiments. In some embodiments, at least some of the peripheral circuits (e.g., word line drivers 508, page buffers 510) and NAND memory 506 (e.g., the array of NAND memory cells) are stacked one over another, i.e., in different planes. For example, NAND memory 506 (e.g., the array of NAND memory cells) may be formed above or below the peripheral circuits to further reduce the chip size. In some embodiments, at least some of the peripheral circuits (e.g., row decoders 514, column decoders 516) and DRAM 512 (e.g., the array of DRAM cells) are stacked one over another, i.e., in different planes. For example, DRAM 512 (e.g., the array of DRAM cells) may be formed above or below the peripheral circuits to further reduce the chip size. Similarly, in some embodiments, at least part of SRAM 504 (e.g., the array of SRAM cells) and processor 502 are stacked one over another, i.e., in different planes. For example, SRAM 504 (e.g., the array of SRAM cells) may be formed above or below processor 502 to further reduce the chip size.

Figure 6A:
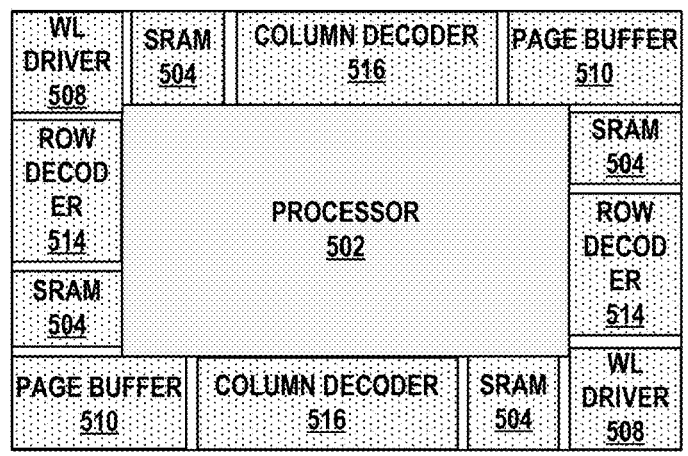
FIG. 6A illustrates a schematic plan view of an exemplary semiconductor structure having a processor, SRAM, and peripheral circuits, according to some embodiments.

FIG. 6A illustrates a schematic plan view of an exemplary semiconductor structure 601 having a processor, SRAM, and peripheral circuits, according to some embodiments. Semiconductor structure 601 may be one example of third semiconductor structure 406 in FIGS. 4A and 4B. Semiconductor structure 601 can include processor 502 on the same substrate as SRAM 504 and the peripheral circuits of both NAND memory 506 and DRAM 512 (e.g., word line drivers 508, page buffers 510, row decoders 514, column decoders 516) and fabricated using the same logic process as SRAM 504 and the peripheral circuits. Processor 502 can include one or more of CPUs, GPUs, DSPs, application processors, baseband processors, to name a few. Both SRAM 504 and the peripheral circuits (e.g., word line drivers 508, page buffers 510, row decoders 514, column decoders 516) can be disposed outside of processor 502. For example, FIG. 6A shows an exemplary layout of SRAM 504 in which the array of SRAM cells are distributed in a plurality of separate regions in semiconductor structure 601, which is outside of processor 502. Semiconductor structure 601 can include all the peripheral circuits for controlling and sensing NAND memory 506, including, for example, word line drivers 508, page buffers 510, and any other suitable devices. Semiconductor structure 601 can also include all the peripheral circuits for controlling and sensing DRAM 512, including, for example, row decoders 514, column decoders 516, and any other suitable devices. FIG. 6A shows an exemplary layout of the peripheral circuits (e.g., word line drivers 508, page buffers 510, row decoders 514, column decoders 516) in which the peripheral circuits and SRAM 504 are formed in different regions in the same plane outside of processor 502. It is understood that in some embodiments, at least some of the peripheral circuits (e.g., word line drivers 508, page buffers 510, row decoders 514, column decoders 516), SRAM 504 (e.g., the array of SRAM cells), and processor 502 are stacked one over another, i.e., in different planes. For example, SRAM 504 (e.g., the array of SRAM cells) may be formed above or below the peripheral circuits to further reduce the chip size.

Figure 6B:
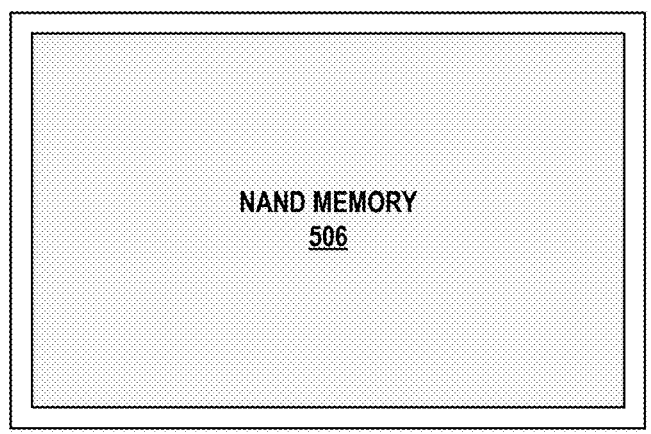
FIG. 6B illustrates a schematic plan view of an exemplary semiconductor structure having NAND memory, according to some embodiments.

FIG. 6B illustrates a schematic plan view of an exemplary semiconductor structure 603 having NAND memory, according to some embodiments. Semiconductor structure 603 may be one example of first semiconductor structure 402 in FIGS. 4A and 4B. By moving all the peripheral circuits (e.g., word line drivers 508, page buffers 510) away from semiconductor structure 603 (e.g., to semiconductor structure 601), the size of NAND memory 506 (e.g., the number of NAND memory cells) in semiconductor structure 603 can be increased.

Figure 6C:
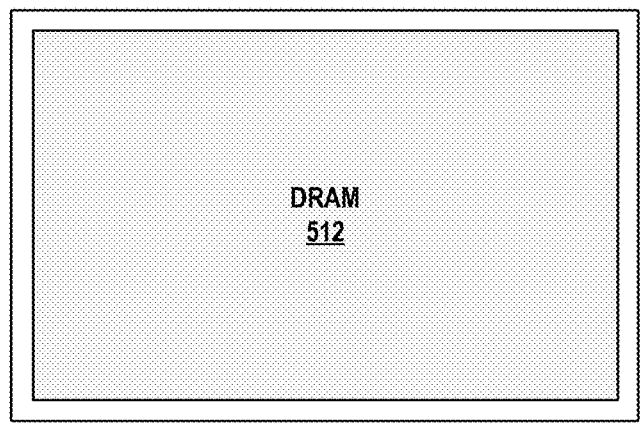
FIG. 6C illustrates a schematic plan view of an exemplary semiconductor structure having DRAM, according to some embodiments.

FIG. 6C illustrates a schematic plan view of an exemplary semiconductor structure 605 having DRAM, according to some embodiments. Semiconductor structure 605 may be one example of second semiconductor structure 404 in FIGS. 4A and 4B. By moving all the peripheral circuits (e.g., row decoders 514, column decoders 516) away from semiconductor structure 605 (e.g., to semiconductor structure 601), the size of DRAM 512 (e.g., the number of DRAM cells) in semiconductor structure 605 can be increased.

Figure 7A:
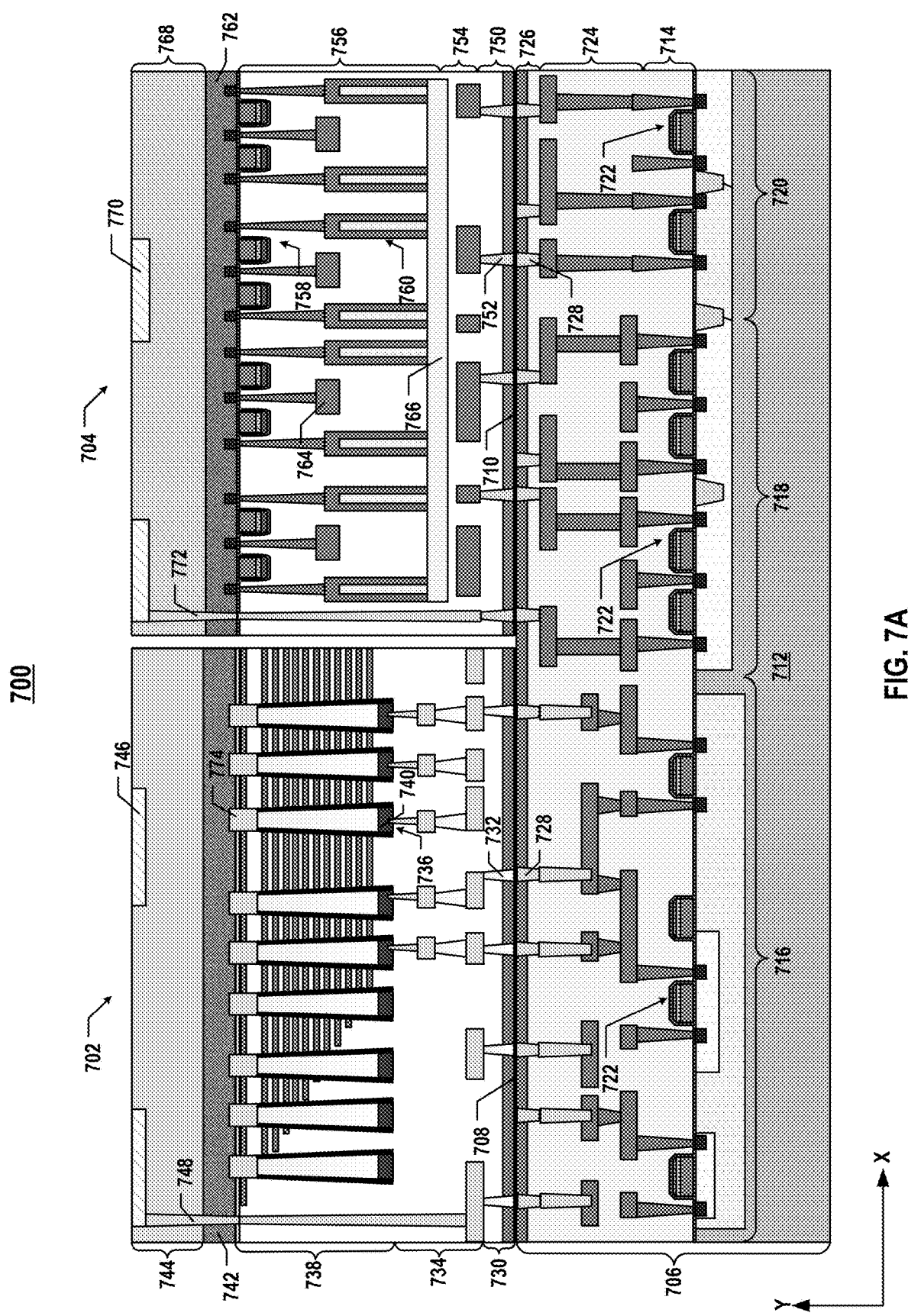
FIG. 7A illustrates a cross-section of an exemplary semiconductor device having heterogeneous memories, according to some embodiments.

FIG. 7A illustrates a cross-section of an exemplary semiconductor device 700 having heterogeneous memories, according to some embodiments. As one example of semiconductor device 400 described above with respect to FIG. 4A, semiconductor device 700 is a bonded chip including a first semiconductor structure 702, a second semiconductor structure 704, and a third semiconductor structure 706 over which both first and second semiconductor structures 702 and 704 are stacked. First and third semiconductor structures 702 and 706 are jointed at a first bonding interface 708 therebetween, according to some embodiments. Second and third semiconductor structures 704 and 706 are jointed at a second bonding interface 710 therebetween, according to some embodiments. First bonding interface 708 and second bonding interface 710 are in the same plane, for example, at the top surface of third semiconductor structure 706 according to some embodiments. As shown in FIG. 7A, third semiconductor structure 706 can include a substrate 712, which can include silicon (e.g., single crystalline silicon, c-Si), silicon germanium (SiGe), gallium arsenide (GaAs), germanium (Ge), silicon on insulator (SOI), or any other suitable materials.

Third semiconductor structure 706 of semiconductor device 700 can include a device layer 714 above substrate 712. It is noted that x- and y-axes are added in FIG. 7A to further illustrate the spatial relationship of the components in semiconductor device 700. Substrate 712 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 700) is determined relative to the substrate of the semiconductor device (e.g., substrate 712) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 714 includes a processor 716 and an array of SRAM cells 718 on substrate 712 and outside of processor 716. In some embodiments, device layer 714 further includes a peripheral circuit 720 on substrate 712 and outside of processor 716. For example, peripheral circuit 720 may be part or the entirety of the peripheral circuits for controlling and sensing the NAND memory and/or DRAM of semiconductor device 700 as described below in detail. In some embodiments, processor 716 includes a plurality of transistors 722 forming any suitable specialized processors and/or SoCs as described above in detail. In some embodiments, transistors 722 also form array of SRAM cells 718 used as, for example, cache and/or data buffer of semiconductor device 700. For example, array of SRAM cells 718 may function as the internal instruction cache and/or data cache of processor 716. Array of SRAM cells 718 can be distributed in a plurality of separate regions in third semiconductor structure 706. In some embodiments, transistors 722 further form peripheral circuit 720, i.e., any suitable digital, analog, and/or mixed-signal control and sensing circuits used for facilitating the operation of the NAND memory and/or DRAM including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors, etc.).

Transistors 722 can be formed "on" substrate 712, in which the entirety or part of transistors 722 are formed in substrate 712 (e.g., below the top surface of substrate 712) and/or directly on substrate 712. Isolation regions (e.g., shallow trench isolations (STIs)) and doped regions (e.g., source regions and drain regions of transistors 722) can be formed in substrate 712 as well. Transistors 722 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, third semiconductor structure 706 of semiconductor device 700 further includes an interconnect layer 724 above device layer 714 to transfer electrical signals to and from processor 716 and array of SRAM cells 718 (and peripheral circuit 720 if any). Interconnect layer 724 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 724 can further include one or more interlayer dielectric (ILD) layers (also known as "intermetal dielectric (IMD) layers") in which the interconnect lines and via contacts can form. That is, interconnect layer 724 can include interconnect lines and via contacts in multiple ILD layers. The interconnect lines and via contacts in interconnect layer 724 can include conductive materials including, but not limited to, tungsten (W), cobalt (Co), Cu, Al, silicides, or any combination thereof. The ILD layers in interconnect layer 724 can include dielectric materials including, but not limited to, silicon oxide, silicon nitride, silicon oxynitride, low dielectric constant (low-k) dielectrics, or any combination thereof. In some embodiments, the devices in device layer 714 are electrically connected to one another through interconnects in interconnect layer 724. For example, array of SRAM cells 718 may be electrically connected to processor 716 through interconnect layer 724.

As shown in FIG. 7A, third semiconductor structure 706 of semiconductor device 700 can further include a bonding layer 726 at first and second bonding interfaces 708 and 710 and above interconnect layer 724 and device layer 714 (including processor 716 and array of SRAM cells 718). Bonding layer 726 can include a plurality of bonding contacts 728 and dielectrics electrically isolating bonding contacts 728. Bonding contacts 728 can include conductive materials including, but not limited to, W, Co, Cu, Al, silicides, or any combination thereof. The remaining area of bonding layer 726 can be formed with dielectrics including, but not limited to, silicon oxide, silicon nitride, silicon oxynitride, low-k dielectrics, or any combination thereof. Bonding contacts 728 and surrounding dielectrics in bonding layer 726 can be used for hybrid bonding.

Similarly, as shown in FIG. 7A, first semiconductor structure 702 of semiconductor device 700 can also include a bonding layer 730 at first bonding interface 708 and above bonding layer 726 of third semiconductor structure 706. Bonding layer 730 can include a plurality of bonding contacts 732 and dielectrics electrically isolating bonding contacts 732. Bonding contacts 732 can include conductive materials including, but not limited to, W, Co, Cu, Al, silicides, or any combination thereof. The remaining area of bonding layer 730 can be formed with dielectrics including, but not limited to, silicon oxide, silicon nitride, silicon oxynitride, low-k dielectrics, or any combination thereof. Bonding contacts 732 and surrounding dielectrics in bonding layer 730 can be used for hybrid bonding. Bonding contacts 732 are in contact with some bonding contacts 728 (e.g., a first set of bonding contacts 728 directly below first semiconductor structure 702) at first bonding interface 708, according to some embodiments.

As described above, first semiconductor structure 702 can be bonded on top of third semiconductor structure 706 in a face-to-face manner at first bonding interface 708. In some embodiments, first bonding interface 708 is disposed between bonding layers 730 and 726 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, first bonding interface 708 is the place at which bonding layers 730 and 726 are met and bonded. In practice, first bonding interface 708 can be a layer with a certain thickness that includes part of the top surface of bonding layer 726 of third semiconductor structure 706 and the bottom surface of bonding layer 730 of first semiconductor structure 702.

In some embodiments, first semiconductor structure 702 of semiconductor device 700 further includes an interconnect layer 734 above bonding layer 730 to transfer electrical signals. Interconnect layer 734 can include a plurality of interconnects, such as MEOL interconnects and BEOL interconnects. In some embodiments, the interconnects in interconnect layer 734 also include local interconnects, such as bit line contacts and word line contacts. Interconnect layer 734 can further include one or more ILD layers in which the interconnect lines and via contacts can form. The interconnect lines and via contacts in interconnect layer 734 can include conductive materials including, but not limited to, W, Co, Cu, Al, silicides, or any combination thereof. The ILD layers in interconnect layer 734 can include dielectric materials including, but not limited to, silicon oxide, silicon nitride, silicon oxynitride, low-k dielectrics, or any combination thereof.

In some embodiments, first semiconductor structure 702 of semiconductor device 700 includes a NAND flash memory device in which memory cells are provided in the form of an array of 3D NAND memory strings 736 above interconnect layer 734 and bonding layer 730. Each 3D NAND memory string 736 extends vertically through a plurality of pairs each including a conductor layer and a dielectric layer, according to some embodiments. The stacked and interleaved conductor layers and dielectric layer are also referred to herein as a memory stack 738. The interleaved conductor layers and dielectric layers in memory stack 738 alternate in the vertical direction, according to some embodiments. In other words, except the ones at the top or bottom of memory stack 738, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string 736 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 736 can have a cylinder shape (e.g., a pillar shape). The semiconductor channel, tunneling layer, storage layer, and blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 736 further include a plurality of control gates (each being part of a word line). Each conductor layer in memory stack 738 can act as a control gate for each memory cell of 3D NAND memory string 736. In some embodiments, each 3D NAND memory string 736 includes two plugs 774 and 740 at a respective end in the vertical direction. Plug 774 can include a semiconductor material, such as single-crystal silicon, that is epitaxially grown from a semiconductor layer 742. Plug 774 can function as the controller of source select gate of 3D NAND memory string 736. Plug 774 can be at the upper end of 3D NAND memory string 736 and in contact with semiconductor layer 742. As used herein, the "upper end" of a component (e.g., 3D NAND memory string 736) is the end farther away from substrate 712 in the y-direction, and the "lower end" of the component (e.g., 3D NAND memory string 736) is the end closer to substrate 712 in the y-direction when substrate 712 is positioned in the lowest plane of semiconductor device 700. Another plug 740 can include semiconductor materials (e.g., polysilicon). By covering the upper end of 3D NAND memory string 736 during the fabrication of first semiconductor structure 702, plug 740 can function as an etch stop layer to prevent etching of dielectrics filled in 3D NAND memory string 736, such as silicon oxide and silicon nitride. In some embodiments, plug 740 functions as the drain of 3D NAND memory string 736.

In some embodiments, first semiconductor structure 702 further includes semiconductor layer 742 disposed above memory stack 738 and 3D NAND memory strings 736. Semiconductor layer 742 can be a thinned substrate on which memory stack 738 and 3D NAND memory strings 736 are formed. In some embodiments, semiconductor layer 742 includes single-crystal silicon from which plugs 774 can be epitaxially grown. In some embodiments, semiconductor layer 742 can include polysilicon, amorphous silicon, SiGe, GaAs, Ge, or any other suitable materials. Semiconductor layer 742 can also include isolation regions and doped regions (e.g., functioning as an array common source (ACS) for 3D NAND memory strings 736, not shown). Isolation regions (not shown) can extend across the entire thickness or part of the thickness of semiconductor layer 742 to electrically isolate the doped regions. In some embodiments, a pad oxide layer including silicon oxide is disposed between memory stack 738 and semiconductor layer 742.

It is understood that 3D NAND memory strings 736 are not limited to the "charge trap" type of 3D NAND memory strings and may be "floating gate" type of 3D NAND memory strings in other embodiments. It is also understood that memory stack 738 is not limited to having the single-deck structure but also can have a multiple-deck structure with inter-deck plugs among different decks for electrical connections of 3D NAND memory strings 736. Semiconductor layer 742 may include polysilicon as the source plate of the "floating gate" type of 3D NAND memory strings.

As shown in FIG. 7A, first semiconductor structure 702 of semiconductor device 700 can further include a pad-out interconnect layer 744 above semiconductor layer 742. Pad-out interconnect layer 744 can include interconnects, e.g., contact pads 746, in one or more ILD layers. Pad-out interconnect layer 744 and interconnect layer 734 can be formed at opposite sides of semiconductor layer 742. In some embodiments, interconnects in pad-out interconnect layer 744 can transfer electrical signals between semiconductor device 700 and outside circuits, e.g., for pad-out purposes.

In some embodiments, first semiconductor structure 702 further includes one or more contacts 748 extending through semiconductor layer 742 to electrically connect pad-out interconnect layer 744 and interconnect layers 734 and 724. As a result, processor 716 and array of SRAM cells 718 (and peripheral circuit 720 if any) can be electrically connected to array of 3D NAND memory strings 736 through interconnect layers 734 and 724 as well as bonding contacts 732 and 728. Moreover, processor 716, array of SRAM cells 718, and array of 3D NAND memory strings 736 can be electrically connected to outside circuits through contacts 748 and pad-out interconnect layer 744.

As illustrated in FIG. 7A, second semiconductor structure 704 of semiconductor device 700 can also include a bonding layer 750 at second bonding interface 710 and above bonding layer 726 of third semiconductor structure 706. Bonding layer 750 can include a plurality of bonding contacts 752 and dielectrics electrically isolating bonding contacts 752. Bonding contacts 752 can include conductive materials including, but not limited to, W, Co, Cu, Al, silicides, or any combination thereof. The remaining area of bonding layer 750 can be formed with dielectrics including, but not limited to, silicon oxide, silicon nitride, silicon oxynitride, low-k dielectrics, or any combination thereof. Bonding contacts 752 and surrounding dielectrics in bonding layer 750 can be used for hybrid bonding. Bonding contacts 752 are in contact with some bonding contacts 728 (e.g., a second set of bonding contacts 728 directly below second semiconductor structure 704) at second bonding interface 710, according to some embodiments.

As described above, second semiconductor structure 704 can be bonded on top of third semiconductor structure 706 in a face-to-face manner at second bonding interface 710, next to first semiconductor structure 702 bonded on top of third semiconductor structure 706 in a face-to-face manner as well at first bonding interface 708. As a result, first and second bonding interfaces 708 and 710 can be in the same plane, for example, both at the top surface of third semiconductor structure 706. In other words, first bonding interface 708 is flush with second bonding interface 710, according to some embodiments. In some embodiments, second bonding interface 710 is disposed between bonding layers 750 and 726 as a result of hybrid bonding as well. In some embodiments, second bonding interface 710 is the place at which bonding layers 750 and 726 are met and bonded. In practice, second bonding interface 710 can be a layer with a certain thickness that includes part of the top surface of bonding layer 726 of third semiconductor structure 706 and the bottom surface of bonding layer 750 of second semiconductor structure 704.

In some embodiments, second semiconductor structure 704 of semiconductor device 700 further includes an interconnect layer 754 above bonding layer 750 to transfer electrical signals. Interconnect layer 754 can include a plurality of interconnects, such as MEOL interconnects and BEOL interconnects. In some embodiments, interconnects in interconnect layer 754 also include local interconnects, such as bit line contacts and word line contacts. Interconnect layer 754 can further include one or more ILD layers in which the interconnect lines and via contacts can form. The interconnect lines and via contacts in interconnect layer 754 can include conductive materials including, but not limited to, W, Co, Cu, Al, silicides, or any combination thereof. The ILD layers in interconnect layer 754 can include dielectric materials including, but not limited to, silicon oxide, silicon nitride, silicon oxynitride, low-k dielectrics, or any combination thereof.

Second semiconductor structure 704 of semiconductor device 700 can further include an array of DRAM cells 756 above interconnect layer 754 and bonding layer 750. In some embodiments, each DRAM cell 756 includes a DRAM selection transistor 758 and a capacitor 760. DRAM cell 756 can be a 1T1C cell consisting of one transistor and one capacitor. It is understood that DRAM cell 756 may be of any suitable configurations, such as 2T1C cell, 3T1C cell, etc. In some embodiments, DRAM selection transistors 758 are formed "on" a semiconductor layer 762, in which the entirety or part of DRAM selection transistors 758 are formed in semiconductor layer 762 (e.g., below the top surface of semiconductor layer 762) and/or directly on semiconductor layer 762. Isolation regions (e.g., STIs) and doped regions (e.g., source regions and drain regions of DRAM selection transistors 758) can be formed in semiconductor layer 762 as well. In some embodiments, capacitors 760 are disposed below DRAM selection transistors 758. Each capacitor 760 includes two electrodes, one of which is electrically connected to one node of respective DRAM selection transistor 758, according to some embodiments. Another node of each DRAM selection transistor 758 is electrically connected to a bit line 764 of DRAM, according to some embodiments. Another electrode of each capacitor 760 can be electrically connected to a common plate 766, e.g., a common ground. It is understood that the structure and configuration of DRAM cell 756 are not limited to the example in FIG. 7A and may include any suitable structure and configuration. For example, capacitor 760 may be a planar capacitor, a stack capacitor, a multi-fins capacitor, a cylinder capacitor, a trench capacitor, or a substrate-plate capacitor.

In some embodiments, second semiconductor structure 704 further includes semiconductor layer 762 disposed above and in contact with array of DRAM cells 756. Semiconductor layer 762 can be a thinned substrate on which DRAM selection transistors 758 are formed. In some embodiments, semiconductor layer 762 includes single-crystal silicon. In some embodiments, semiconductor layer 762 can include polysilicon, amorphous silicon, SiGe, GaAs, Ge, silicide or any other suitable materials. Semiconductor layer 762 can also include isolation regions and doped regions (e.g., as the sources and drains of DRAM selection transistors 758).

As shown in FIG. 7A, second semiconductor structure 704 of semiconductor device 700 can further include a pad-out interconnect layer 768 above semiconductor layer 762. Pad-out interconnect layer 768 can include interconnects, e.g., contact pads 770, in one or more ILD layers. Pad-out interconnect layer 768 and interconnect layer 754 can be formed at opposite sides of semiconductor layer 762. In some embodiments, interconnects in pad-out interconnect layer 768 can transfer electrical signals between semiconductor device 700 and outside circuits, e.g., for pad-out purposes.

In some embodiments, second semiconductor structure 704 further includes one or more contacts 772 extending through semiconductor layer 762 to electrically connect pad-out interconnect layer 768 and interconnect layers 754 and 724. As a result, processor 716 and array of SRAM cells 718 (and peripheral circuit 720 if any) can be electrically connected to array of DRAM cells 756 through interconnect layers 754 and 724 as well as bonding contacts 752 and 728. Also, array of 3D NAND memory strings 736 in first semiconductor structure 702 can be electrically connected to array of DRAM cells 756 in second semiconductor structure 704 through interconnect layers 734, 724, and 754 as well as bonding contacts 732, 728, and 752. Moreover, processor 716, array of SRAM cells 718, and array of DRAM cells 756 can be electrically connected to outside circuits through contacts 772 and pad-out interconnect layer 768.

Figure 7B:
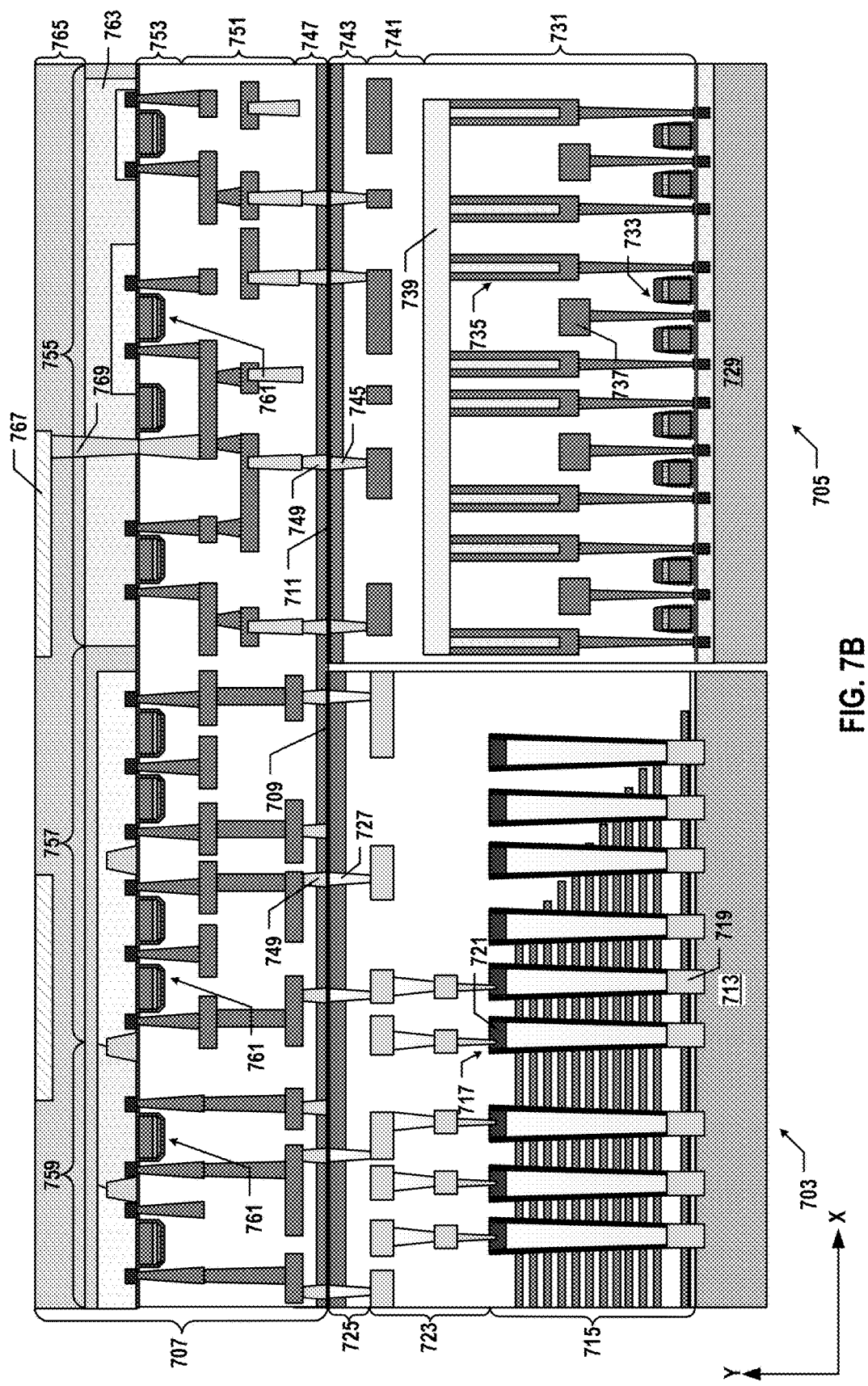
FIG. 7B illustrates a cross-section of another exemplary semiconductor device having heterogeneous memories, according to some embodiments.

FIG. 7B illustrates a cross-section of another exemplary semiconductor device 701 having heterogeneous memories, according to some embodiments. As one example of semiconductor device 401 described above with respect to FIG. 4B, semiconductor device 701 is a bonded chip including a third semiconductor structure 707 stacked over a first semiconductor structure 703 and a second semiconductor structure 705. Similar to semiconductor device 700 described above in FIG. 7A, semiconductor device 701 represents an example of a bonded chip in which third semiconductor structure 707 including a processor and SRAM, first semiconductor structure 703 including NAND memory, and second semiconductor structure 705 including DRAM are formed separately and bonded in a face-to-face manner at a first bonding interface 709 and a second bonding interface 711, respectively. Different from semiconductor device 700 described above in FIG. 7A in which third semiconductor structure 706 including the processor and SRAM is below first semiconductor structure 702 including the NAND memory and second semiconductor structure 704 including the DRAM, semiconductor device 701 in FIG. 7B includes third semiconductor structure 707 disposed above first semiconductor structure 703 and second semiconductor structure 705. It is understood that the details of similar structures (e.g., materials, fabrication process, functions, etc.) in both semiconductor devices 700 and 701 may not be repeated below.

First semiconductor structure 703 of semiconductor device 701 can include a substrate 713 and a memory stack 715 including interleaved conductor layers and dielectric layers above substrate 713. In some embodiments, an array of 3D NAND memory strings 717 each extends vertically through the interleaved conductor layers and dielectric layers in memory stack 715 above substrate 713. Each 3D NAND memory string 717 can include a semiconductor channel and a memory film. Each 3D NAND memory string 717 further includes two plugs 719 and 721 at its lower end and upper end, respectively. 3D NAND memory strings 717 can be "charge trap" type of 3D NAND memory strings or "floating gate" type of 3D NAND memory strings. In some embodiments, a pad oxide layer including silicon oxide is disposed between memory stack 715 and substrate 713.

In some embodiments, first semiconductor structure 703 of semiconductor device 701 also includes an interconnect layer 723 above memory stack 715 and 3D NAND memory strings 717 to transfer electrical signals to and from 3D NAND memory strings 717. Interconnect layer 723 can include a plurality of interconnects, including interconnect lines and via contacts. In some embodiments, interconnects in interconnect layer 723 also include local interconnects, such as bit line contacts and word line contacts. In some embodiments, first semiconductor structure 703 of semiconductor device 701 further includes a bonding layer 725 at first bonding interface 709 and above interconnect layer 723 and memory stack 715 (including 3D NAND memory strings 717 therethrough). Bonding layer 725 can include a plurality of bonding contacts 727 and dielectrics surrounding and electrically isolating bonding contacts 727.

Second semiconductor structure 705 of semiconductor device 701 can include a substrate 729 and an array of DRAM cells 731 on substrate 729. Although substrate 713 and substrate 729 are shown as two separate substrates in FIG. 7B, it is understood that in some embodiments, substrates 713 and 729 may be a single, continuous substrate. It is further understood that in some embodiments, another single, continuous substrate (e.g., not shown) may be formed below substrate 713 and substrate 729 and bonded to substrate 713 and 729 to provide further support to semiconductor device 701.

In some embodiments, each DRAM cell 731 includes a DRAM selection transistor 733 and a capacitor 735. DRAM cell 731 can be a 1T1C cell consisting of one transistor and one capacitor. It is understood that DRAM cell 731 may be of any suitable configuration, such as 2T1C cell, 3T1C cell, etc. In some embodiments, DRAM selection transistors 733 are formed "on" substrate 729, in which the entirety or part of DRAM selection transistors 733 are formed in substrate 729 and/or directly on substrate 729. In some embodiments, capacitors 735 are disposed above DRAM selection transistors 733. Each capacitor 735 includes two electrodes, one of which is electrically connected to one node of respective DRAM selection transistor 733, according to some embodiments. Another node of each DRAM selection transistor 733 is electrically connected to a bit line 737 of DRAM, according to some embodiments. Another electrode of each capacitor 735 can be electrically connected to a common plate 739, e.g., a common ground. It is understood that the structure and configuration of DRAM cell 731 are not limited to the example in FIG. 7B and may include any suitable structure and configuration.

In some embodiments, second semiconductor structure 705 of semiconductor device 701 also includes an interconnect layer 741 above array of DRAM cells 731 to transfer electrical signals to and from array of DRAM cells 731. Interconnect layer 741 can include a plurality of interconnects, including interconnect lines and via contacts. In some embodiments, interconnects in interconnect layer 741 also include local interconnects, such as bit line contacts and word line contacts. In some embodiments, second semiconductor structure 705 of semiconductor device 701 further includes a bonding layer 743 at second bonding interface 711 and above interconnect layer 741 and array of DRAM cells 731. Bonding layer 743 can include a plurality of bonding contacts 745 and dielectrics surrounding and electrically isolating bonding contacts 745.

As shown in FIG. 7B, third semiconductor structure 707 of semiconductor device 701 includes another bonding layer 747 at first bonding interface 709 and second bonding interface 711 and above bonding layer 725 of first semiconductor structure 703 and bonding layer 743 of second semiconductor structure 705. Bonding layer 747 can include a plurality of bonding contacts 749 and dielectrics surrounding and electrically isolating bonding contacts 749. Some bonding contacts 749 (e.g., a first set of bonding contacts 749 directly above first semiconductor structure 703) are in contact with bonding contacts 727 at first bonding interface 709, according to some embodiments. Some bonding contacts 749 (e.g., a second set of bonding contacts 749 directly above second semiconductor structure 705) are in contact with bonding contacts 745 at second bonding interface 711, according to some embodiments. First and second bonding interfaces 709 and 711 can be in the same plane, for example, both at the bottom surface of third semiconductor structure 707. In other words, first bonding interface 709 is flush with second bonding interface 711, according to some embodiments. In some embodiments, third semiconductor structure 707 of semiconductor device 701 also includes an interconnect layer 751 above bonding layer 747 to transfer electrical signals. Interconnect layer 751 can include a plurality of interconnects, including interconnect lines and via contacts.

Third semiconductor structure 707 of semiconductor device 701 can further include a device layer 753 above interconnect layer 751 and bonding layer 747. In some embodiments, device layer 753 includes a processor 755 above interconnect layer 751 and bonding layer 747, and an array of SRAM cells 757 above interconnect layer 751 and bonding layer 747 and outside of processor 755. In some embodiments, device layer 753 further includes a peripheral circuit 759 above interconnect layer 751 and bonding layer 747 and outside of processor 755. For example, peripheral circuit 759 may be part or the entirety of the peripheral circuits for controlling and sensing array of 3D NAND memory strings 717 and/or array of DRAM cells 731. In some embodiments, the devices in device layer 753 are electrically connected to one another through interconnects in interconnect layer 751. For example, array of SRAM cells 757 may be electrically connected to processor 755 through interconnect layer 751.

In some embodiments, processor 755 includes a plurality of transistors 761 forming any suitable specialized processors and/or SoCs. Transistors 761 can be formed "on" a semiconductor layer 763, in which the entirety or part of transistors 761 are formed in semiconductor layer 763 and/or directly on semiconductor layer 763. Isolation regions (e.g., STIs) and doped regions (e.g., source regions and drain regions of transistors 761) can be formed in semiconductor layer 763 as well. Transistors 761 can form array of SRAM cells 757 (and peripheral circuit 759 if any) as well. Transistors 761 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, third semiconductor structure 707 further includes semiconductor layer 763 disposed above device layer 753. Semiconductor layer 763 can be above and in contact with processor 755 and array of SRAM cells 757. Semiconductor layer 763 can be a thinned substrate on which transistors 761 are formed. In some embodiments, semiconductor layer 763 includes single-crystal silicon. In some embodiments, semiconductor layer 763 can include polysilicon, amorphous silicon, SiGe, GaAs, Ge, or any other suitable materials. Semiconductor layer 763 can also include isolation regions and doped regions.

As shown in FIG. 7B, third semiconductor structure 707 of semiconductor device 701 can further include a pad-out interconnect layer 765 above semiconductor layer 763. Pad-out interconnect layer 765 can include interconnects, e.g., contact pads 767, in one or more ILD layers. In some embodiments, interconnects in pad-out interconnect layer 765 can transfer electrical signals between semiconductor device 701 and outside circuits, e.g., for pad-out purposes. In some embodiments, third semiconductor structure 707 further includes one or more contacts 769 extending through semiconductor layer 763 to electrically connect pad-out interconnect layer 765 and interconnect layers 751, 723, and 741. As a result, processor 755 and array of SRAM cells 757 (and peripheral circuit 759 if any) can be electrically connected to array of 3D NAND memory strings 717 through interconnect layers 751 and 723 as well as bonding contacts 749 and 727, and processor 755 and array of SRAM cells 757 (and peripheral circuit 759 if any) can also be electrically connected to array of DRAM cells 731 through interconnect layers 751 and 741 as well as bonding contacts 749 and 745. Also, array of 3D NAND memory strings 717 in first semiconductor structure 703 are electrically connected to array of DRAM cells 731 in second semiconductor structure 705 through interconnect layers 723, 751, and 741 as well as bonding contacts 727, 749, and 745. Moreover, processor 755, array of SRAM cells 757, array of 3D NAND memory strings 717, and array of DRAM cells 731 can be electrically connected to outside circuits through contacts 769 and pad-out interconnect layer 765.

Figure 9A:
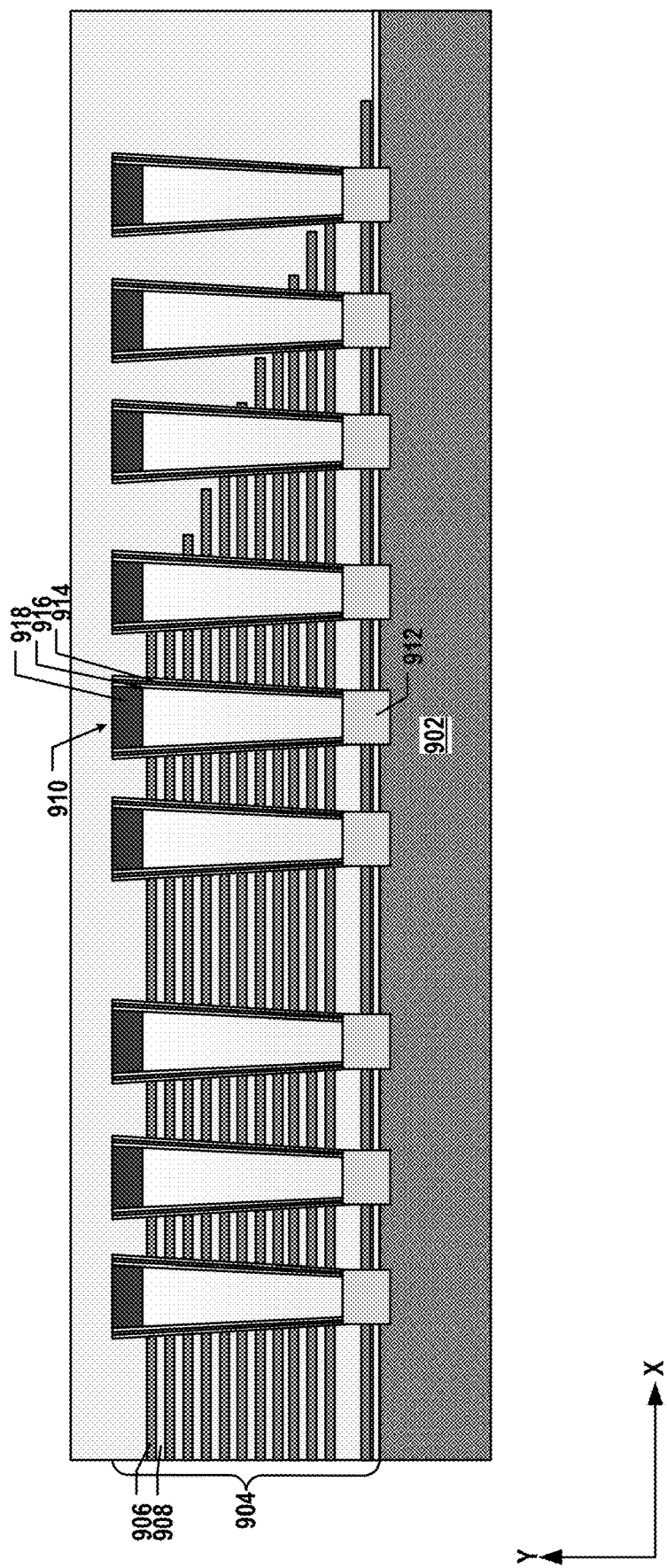
FIGS. 9A and 9B illustrate a fabrication process for forming an exemplary semiconductor structure having 3D NAND memory strings, according to some embodiments.
Figure 9B:
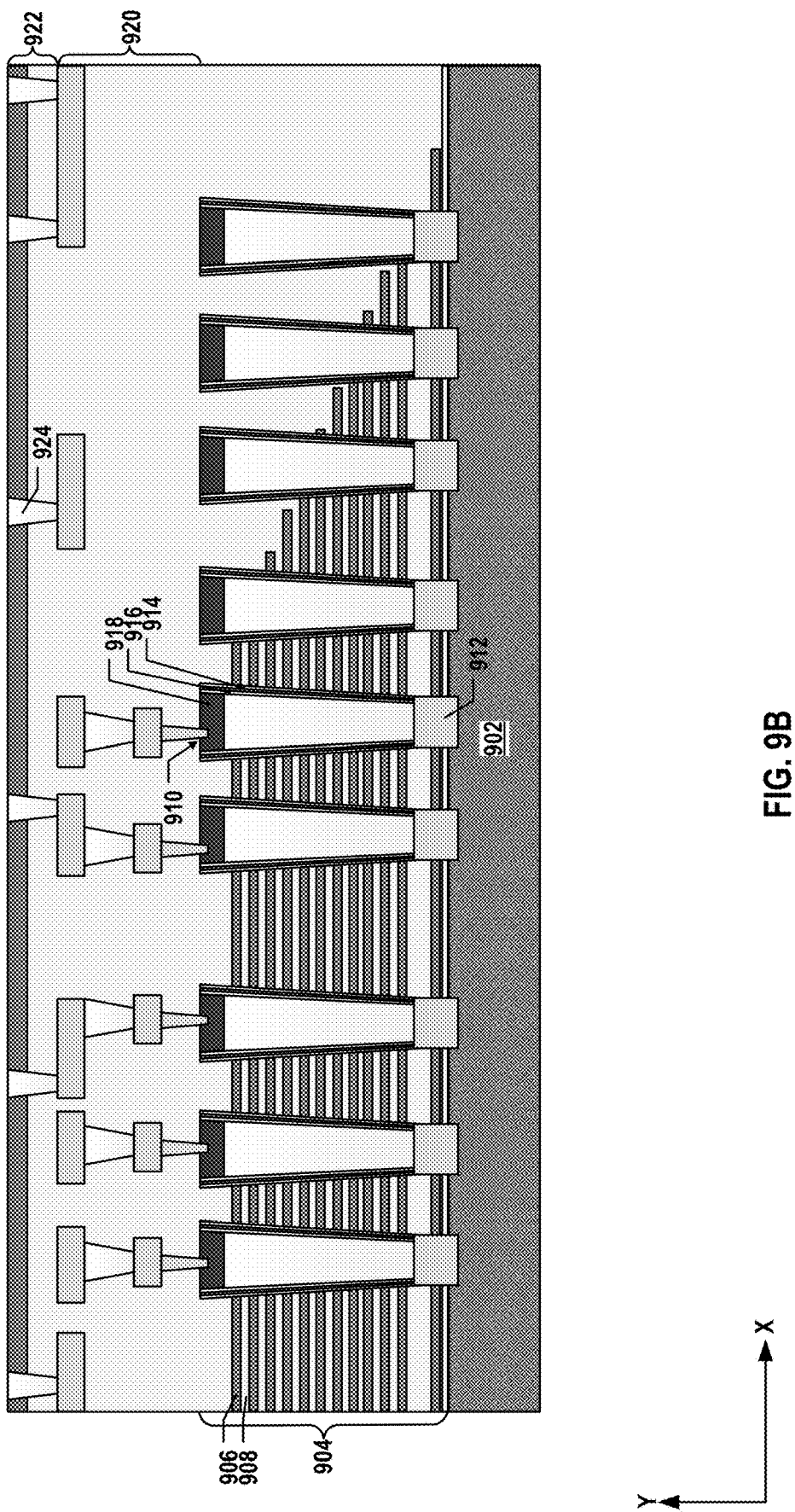
Figure 10A:
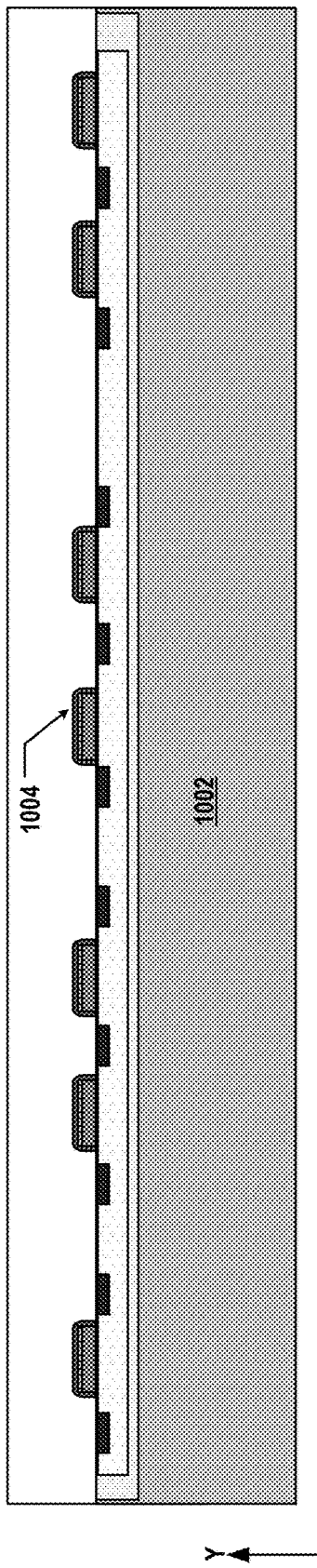
FIGS. 10A-10C illustrate a fabrication process for forming an exemplary semiconductor structure having DRAM cells, according to some embodiments.
Figure 10B:
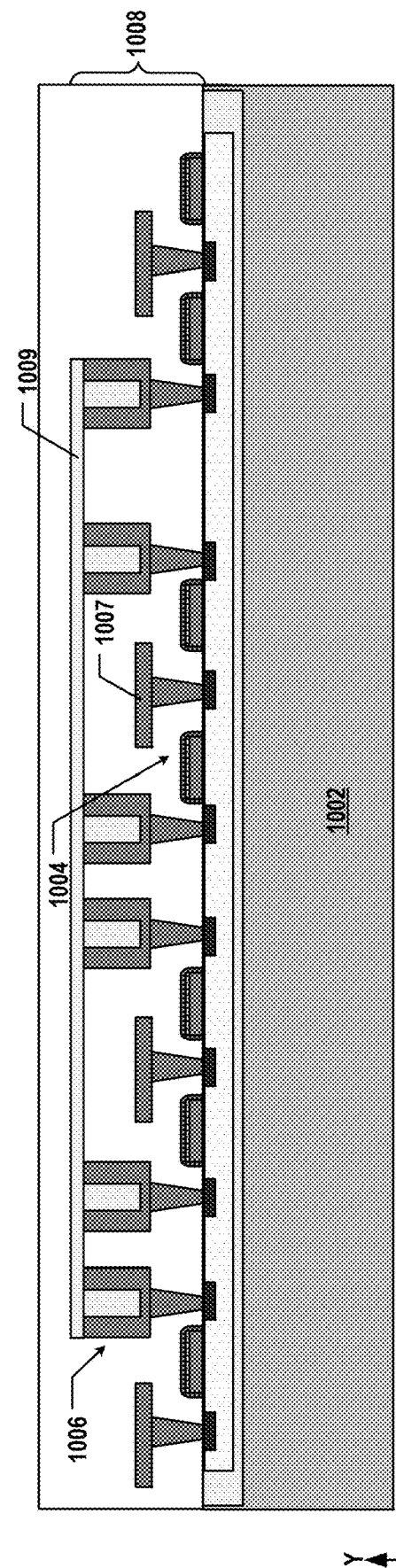
Figure 10C:
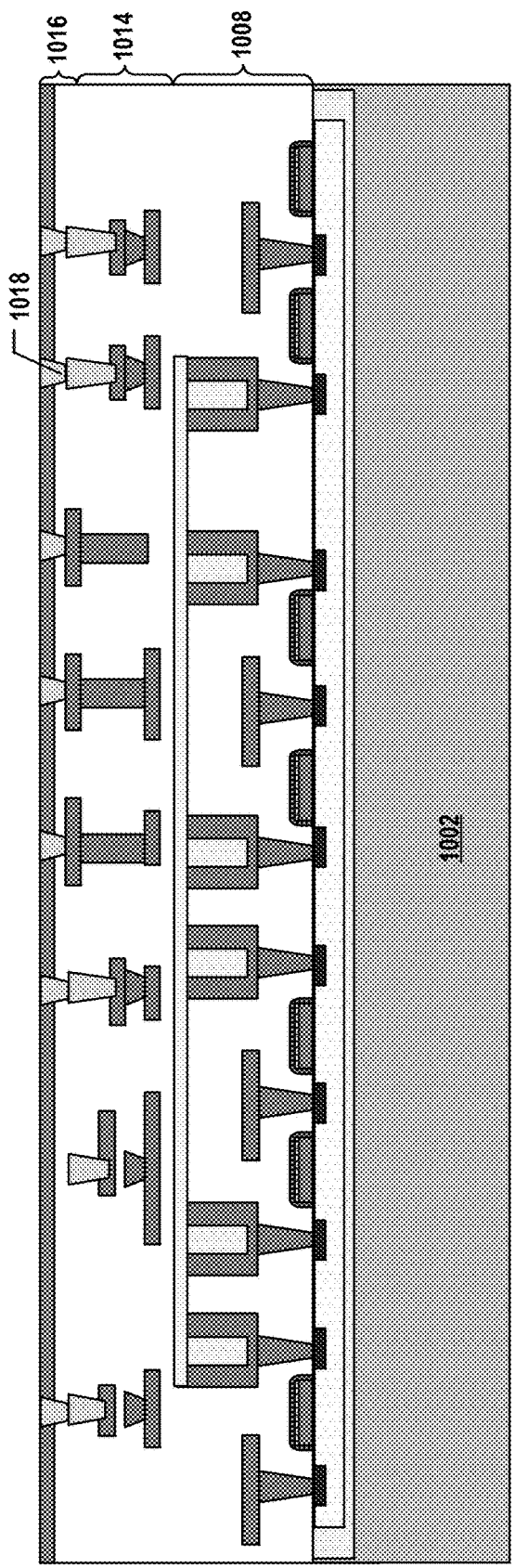
Figure 11A:
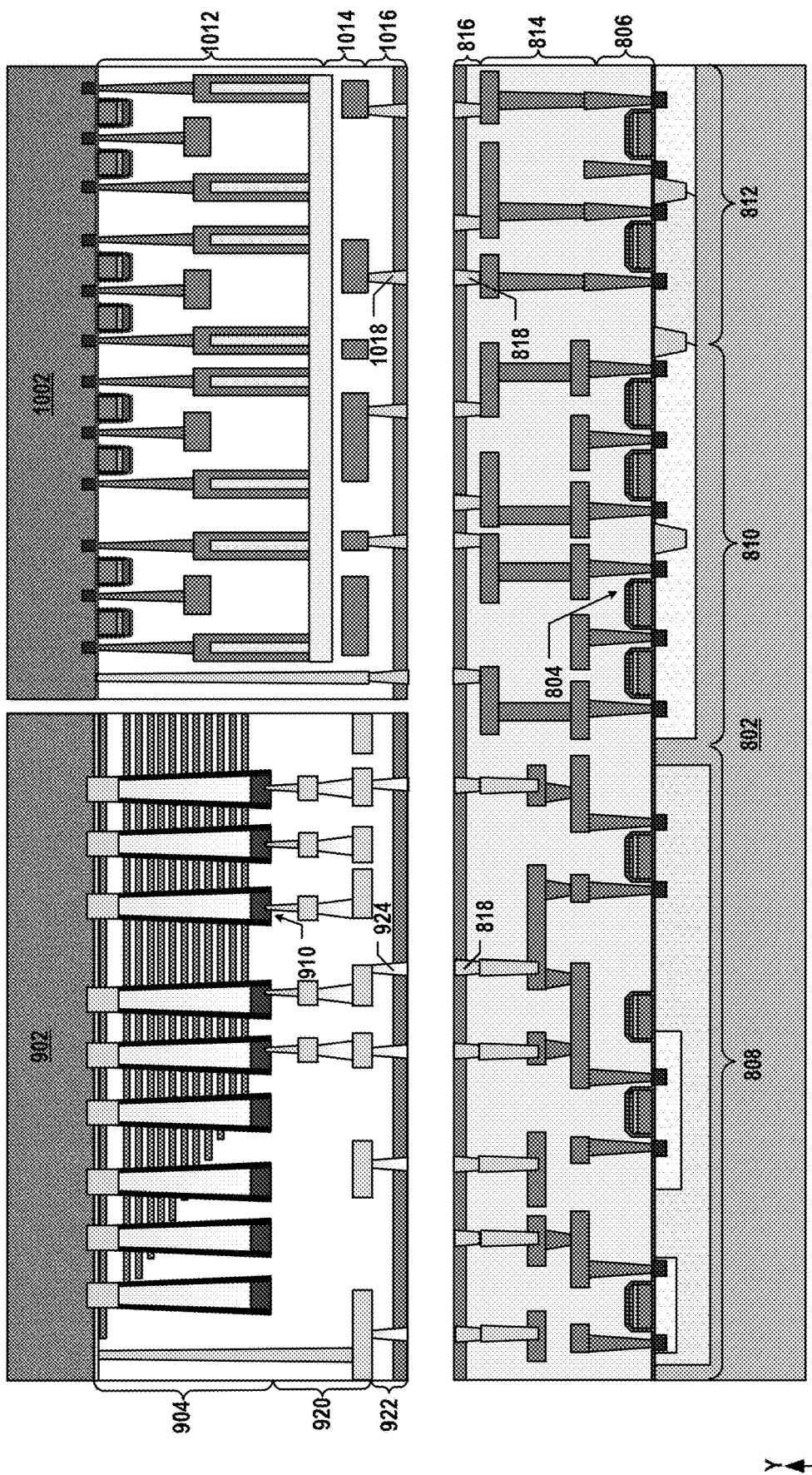
FIGS. 11A and 11B illustrate a fabrication process for forming an exemplary semiconductor device having heterogeneous memories, according to some embodiments.
Figure 11B:
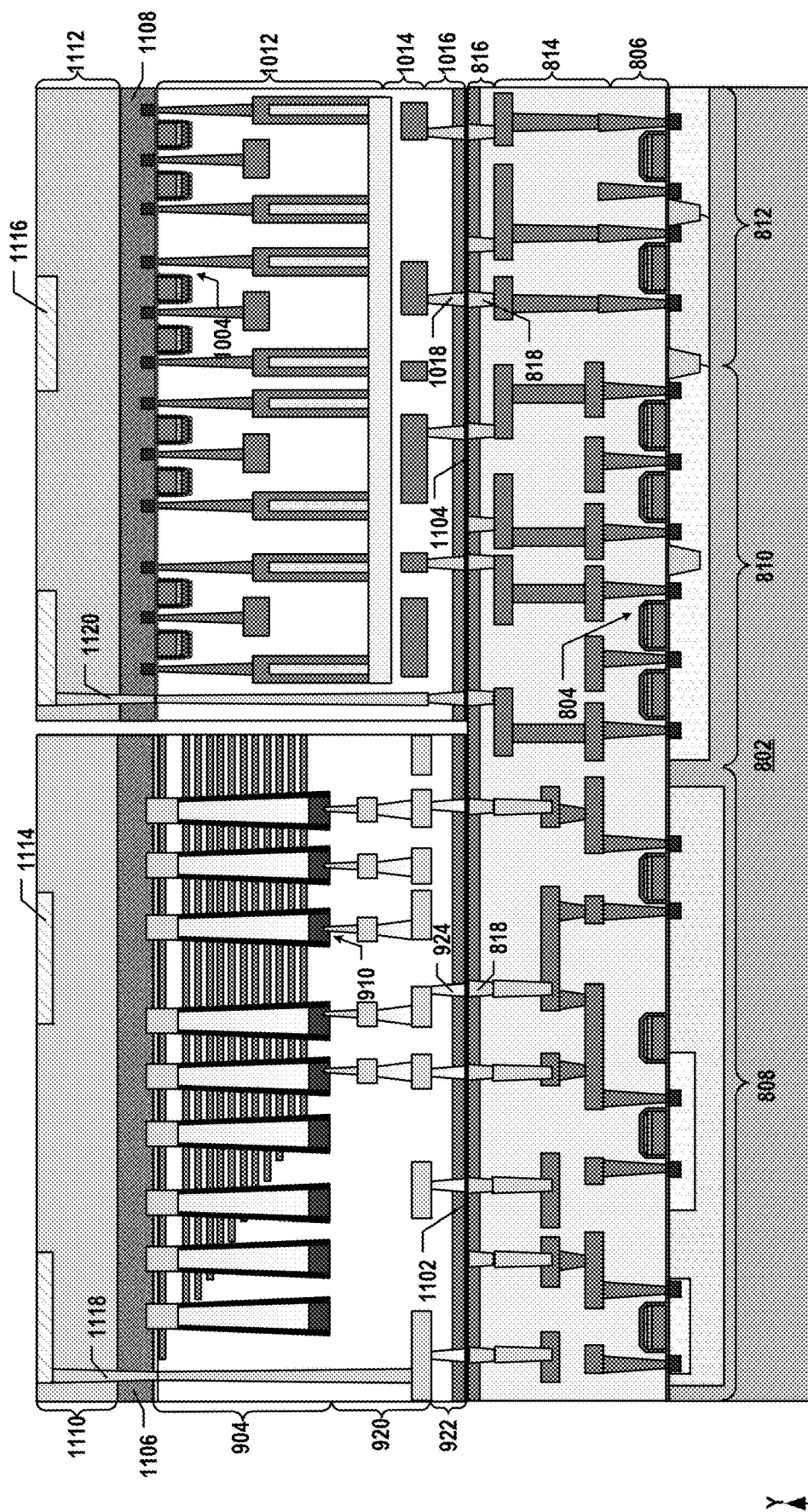
Figure 12A:
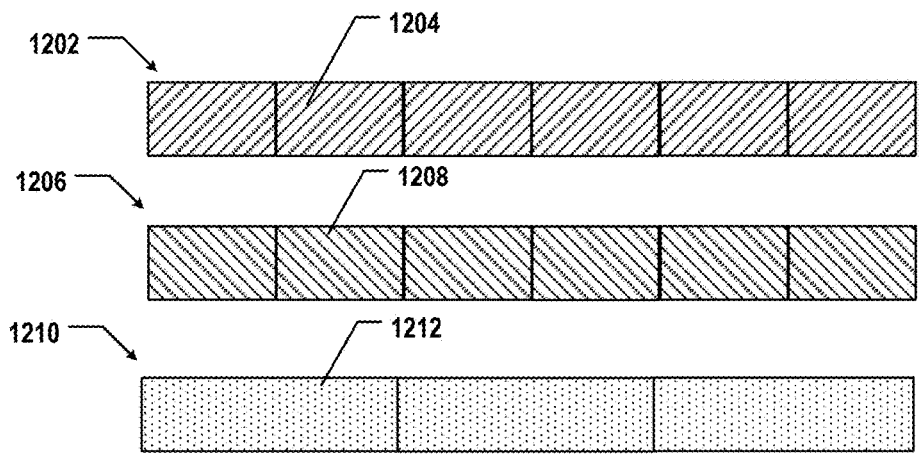
FIGS. 12A-12C illustrate a fabrication process for dicing and bonding an exemplary semiconductor structure, according to some embodiments.
Figure 12B:
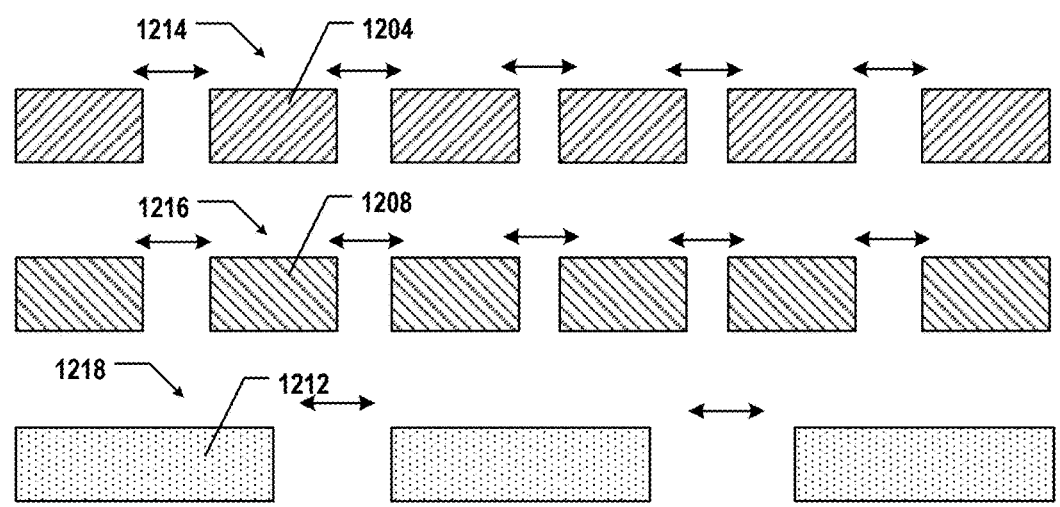
Figure 12C:
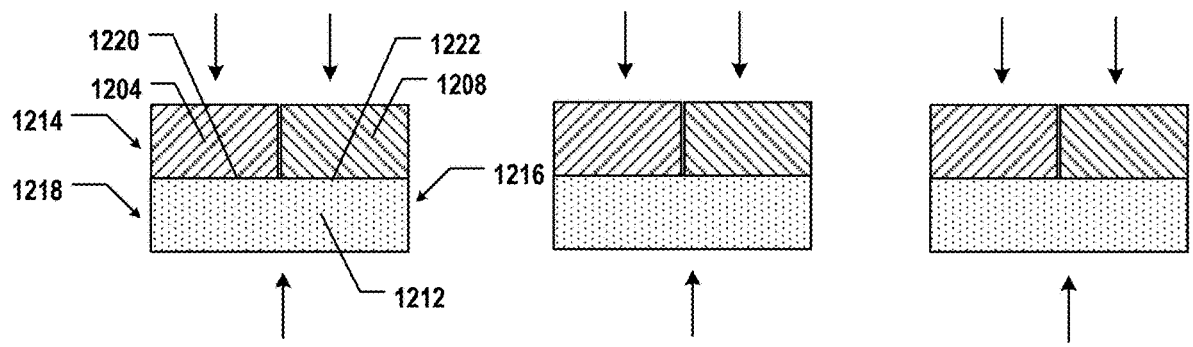
Figure 16A:
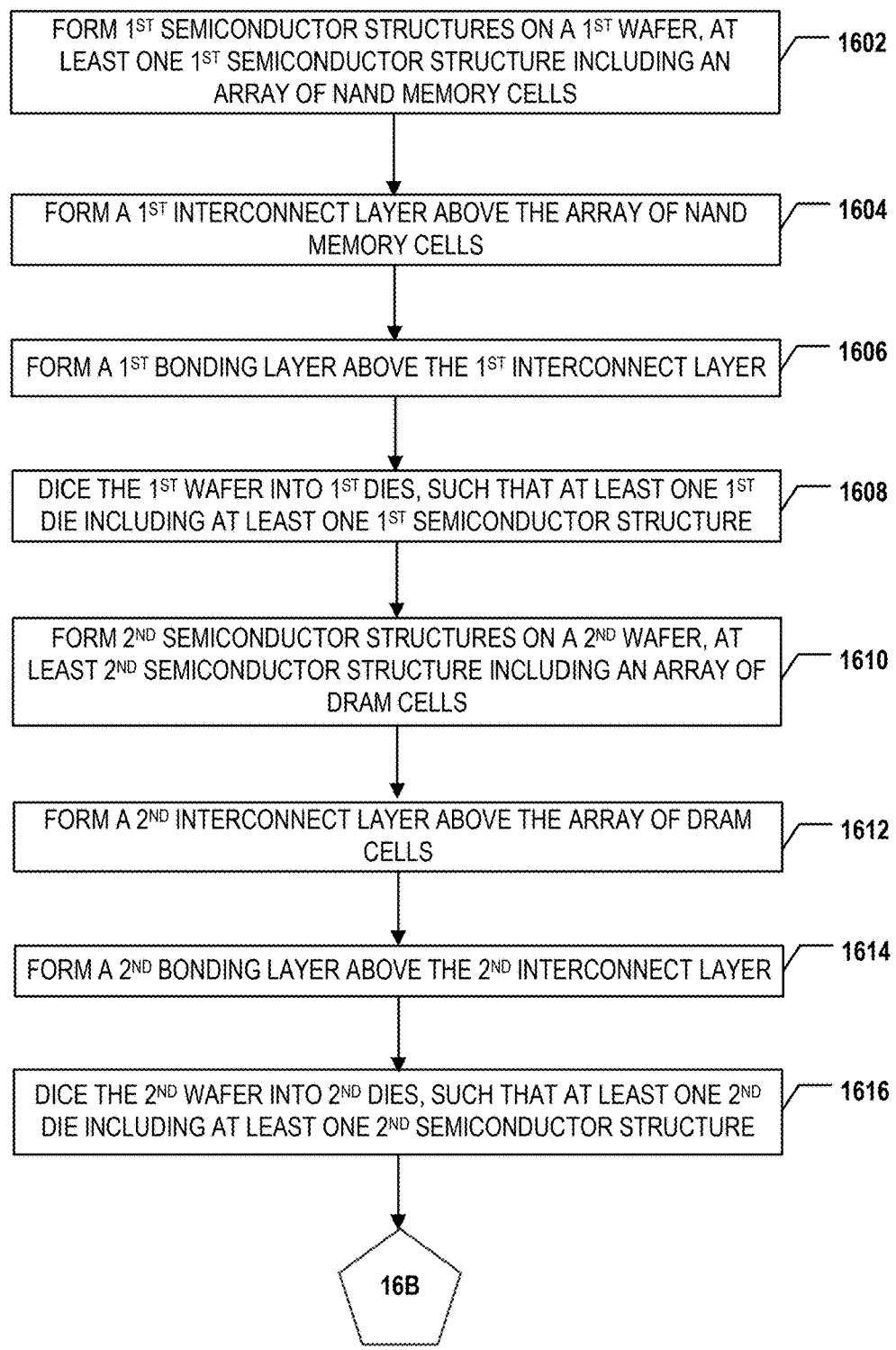
FIGS. 16A and 16B illustrate a flowchart of an exemplary method for forming a semiconductor device having heterogeneous memories, according to some embodiments.
Figure 16B:
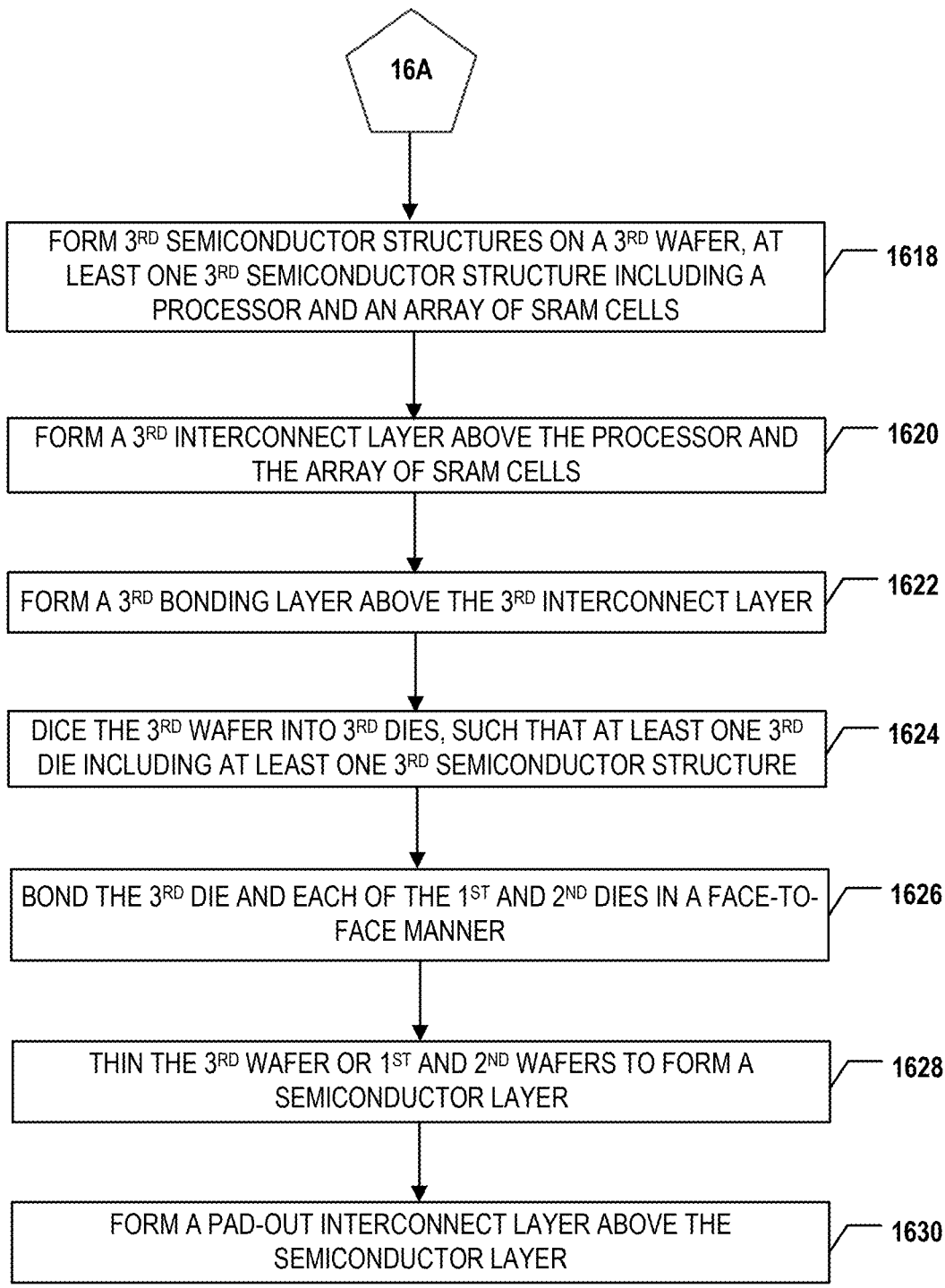
Figure 17A:
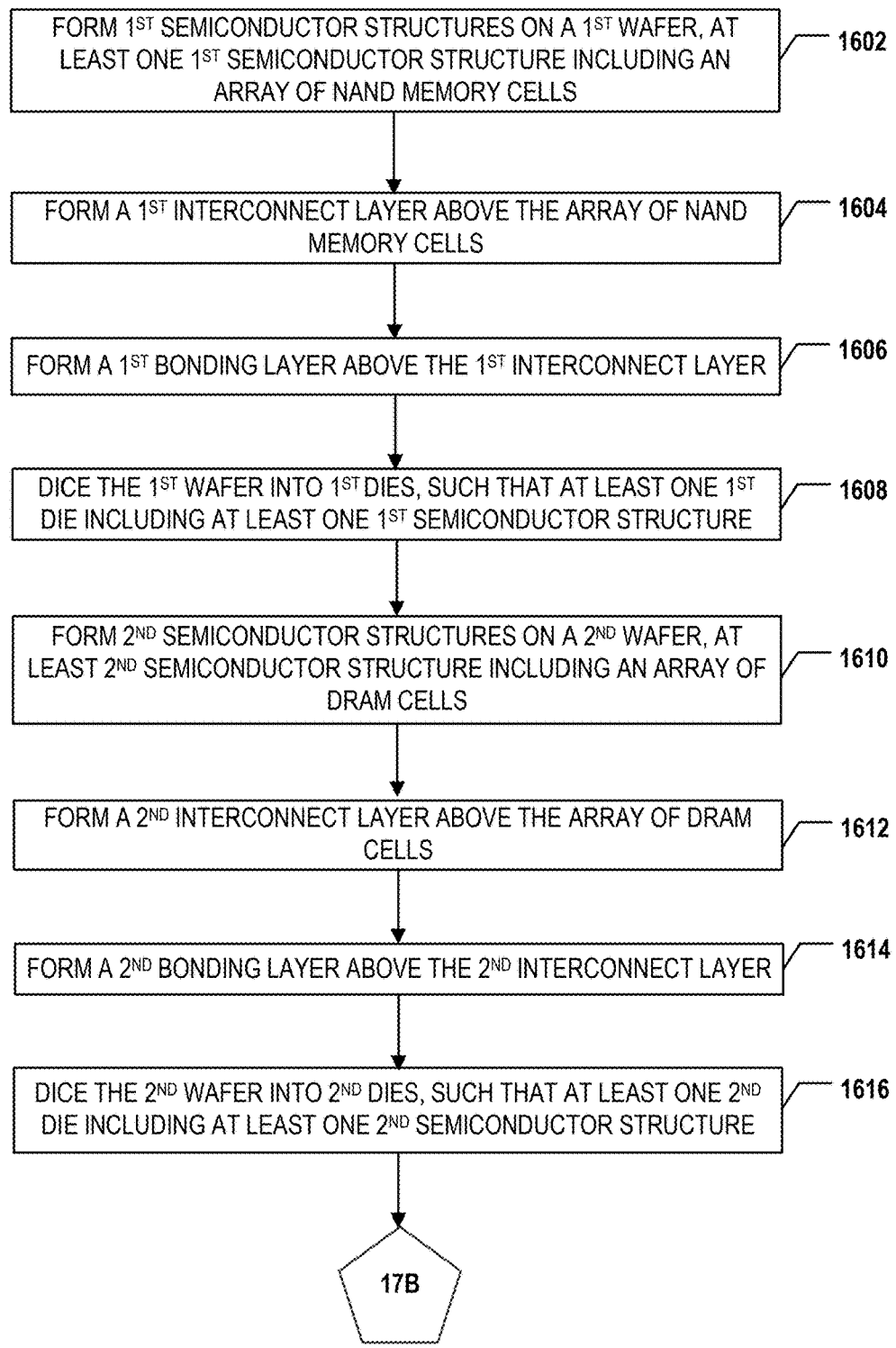
FIGS. 17A and 17B illustrate a flowchart of another exemplary method for forming a semiconductor device having heterogeneous memories, according to some embodiments.
Figure 17B:
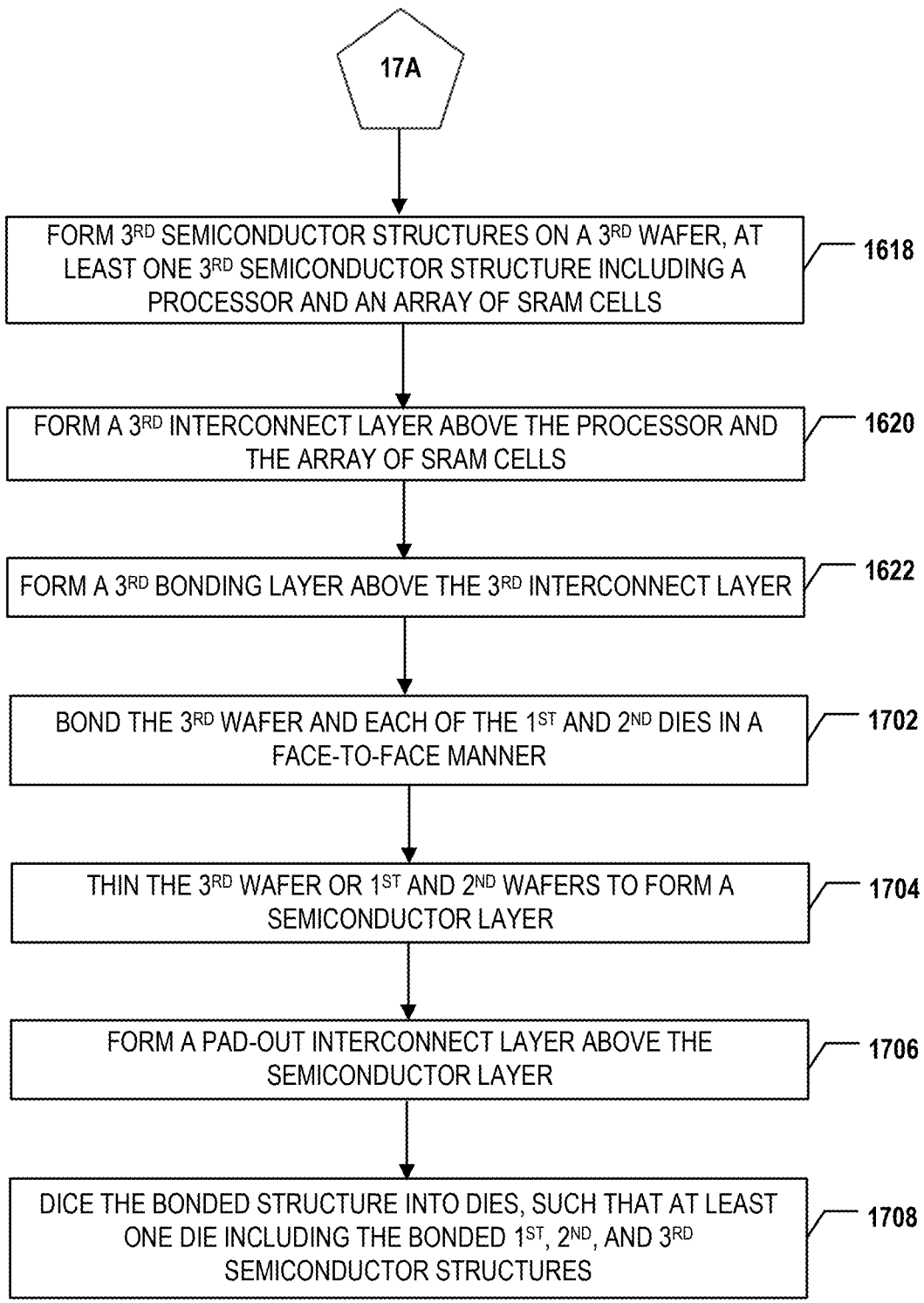

FIGS. 8A and 8B illustrate a fabrication process for forming an exemplary semiconductor structure having a processor, SRAM, and peripheral circuits, according to some embodiments. FIGS. 9A and 9B illustrate a fabrication process for forming an exemplary semiconductor structure having 3D NAND memory strings, according to some embodiments. FIGS. 10A-10C illustrate a fabrication process for forming an exemplary semiconductor structure having DRAM cells, according to some embodiments. FIGS. 11A and 11B illustrate a fabrication process for forming an exemplary semiconductor device having heterogeneous memories, according to some embodiments. FIGS. 12A-12C illustrate a fabrication process for dicing and bonding an exemplary semiconductor structure, according to some embodiments. FIGS. 13A-13D illustrate a fabrication process for bonding and dicing an exemplary semiconductor structure, according to some embodiments. FIGS. 16A and 16B illustrate a flowchart of an exemplary method 1600 for forming a semiconductor device having heterogeneous memories, according to some embodiments. FIGS. 17A and 17B illustrate a flowchart of another exemplary method 1700 for forming a semiconductor device having heterogeneous memories, according to some embodiments. Examples of the semiconductor devices depicted in FIGS. 8A, 8B, 9A, 9B, 10A-10C, 11A, 11B, 12A-12C, 13A-13D, 16A, 16B, 17A, and 17B include semiconductor devices 700 and 701 depicted in FIGS. 7A and 7B. FIGS. 8A, 8B, 9A, 9B, 10A-10C, 11A, 11B, 12A-12C, 13A-13D, 16A, 16B, 17A, and 17B will be described together. It is understood that the operations shown in methods 1600 and 1700 are not exhaustive and that other operations can be performed as well before, after, or between any of the illustrated operations. Further, some of the operations may be performed simultaneously, or in a different order than shown in FIGS. 16A, 16B, 17A, and 17B.

As depicted in FIGS. 9A and 9B, a first semiconductor structure including an array of 3D NAND memory strings and a first bonding layer including a plurality of first bonding contacts is formed. As depicted in FIGS. 10A-10C, a second semiconductor structure including an array of DRAM cells and a second bonding layer including a plurality of second bonding contacts is formed. As depicted in FIGS. 8A and 8B, a third semiconductor structure including a processor, an array of SRAM cells, a peripheral circuit, and a third bonding layer including a plurality of third bonding contacts is formed. As depicted in FIGS. 11A and 11B, the third semiconductor structure and each of the first and second semiconductor structures are bonded in a face-to-face manner, such that the first bonding contacts are in contact with a first set of the third bonding contacts at a first bonding interface, and the second bonding contacts are in contact with a second set of the third bonding contacts at a second bonding interface.

Referring to FIG. 16A, method 1600 starts at operation 1602, in which a plurality of first semiconductor structures are formed on a first wafer. At least one of the first semiconductor structures includes an array of NAND memory cells and a first bonding layer including a plurality of first bonding contacts. The first wafer can be a silicon wafer. In some embodiments, to form the plurality of first semiconductor structures, the array of NAND memory cells is formed on the first wafer. The array of NAND memory cells can be an array of 3D NAND memory strings. In some embodiments, to form the plurality of first semiconductor structures, a peripheral circuit of an array of NAND memory cells is also formed on the first wafer.

As illustrated in FIG. 12A, a plurality of first semiconductor structures 1204 are formed on a first wafer 1202. First wafer 1202 can include a plurality of shots separated by scribing lines. Each shot of first wafer 1202 includes one or more first semiconductor structures 1204, according to some embodiments. FIGS. 9A and 9B illustrate one example of the formation of first semiconductor structure 1204.

In some embodiments, to form the plurality of first semiconductor structures, a memory stack is formed above the first wafer, and an array of 3D NAND memory strings extending vertically through the memory stack are formed. As illustrated in FIG. 9A, interleaved sacrificial layers (not shown) and dielectric layers 908 are formed above a silicon substrate 902 (as part of first wafer 1202, e.g., a silicon wafer). The interleaved sacrificial layers and dielectric layers 908 can form a dielectric stack (not shown). In some embodiments, each sacrificial layer includes a layer of silicon nitride, and each dielectric layer 908 includes a layer of silicon oxide. The interleaved sacrificial layers and dielectric layers 908 can be formed by one or more thin film deposition processes including, but not limited to, chemical vapor deposition (CVD), physical vapor deposition (PVD), atomic layer deposition (ALD), or any combination thereof. In some embodiments, a memory stack 904 can be formed by a gate replacement process, e.g., replacing the sacrificial layers with conductor layers 906 using wet/dry etch of the sacrificial layers selective to dielectric layers 908 and filling the resulting recesses with conductor layers 906. As a result, memory stack 904 can include interleaved conductor layers 906 and dielectric layers 908. In some embodiments, each conductor layer 906 includes a metal layer, such as a layer of tungsten. It is understood that memory stack 904 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 904 and silicon substrate 902.

As illustrated in FIG. 9A, 3D NAND memory strings 910 are formed above silicon substrate 902, each of which extends vertically through interleaved conductor layers 906 and dielectric layers 908 of memory stack 904. In some embodiments, fabrication processes to form 3D NAND memory string 910 include forming a channel hole through memory stack 904 and into silicon substrate 902 using dry etching/and or wet etching, such as deep reactive-ion etching (DRIE), followed by epitaxially growing a plug 912 in the lower portion of the channel hole from silicon substrate 902. In some embodiments, fabrication processes to form 3D NAND memory string 910 also include subsequently filling the channel hole with a plurality of layers, such as a memory film 914 (e.g., a tunneling layer, a storage layer, and a blocking layer) and a semiconductor layer 916, using thin film deposition processes such as ALD, CVD, PVD, or any combination thereof. In some embodiments, fabrication processes to form 3D NAND memory string 910 further include forming another plug 918 in the upper portion of the channel hole by etching a recess at the upper end of 3D NAND memory string 910, followed by filling the recess with a semiconductor material using thin film deposition processes such as ALD, CVD, PVD, or any combination thereof.

Method 1600 proceeds to operation 1604, as illustrated in FIG. 16A, in which a first interconnect layer is formed above the array of NAND memory cells. The first interconnect layer can include a first plurality of interconnects in one or more ILD layers. As illustrated in FIG. 9B, an interconnect layer 920 can be formed above memory stack 904 and array of 3D NAND memory strings 910. Interconnect layer 920 can include interconnects of MEOL and/or BEOL in a plurality of ILD layers to make electrical connections with array of 3D NAND memory strings 910. In some embodiments, interconnect layer 920 includes multiple ILD layers and interconnects therein formed in multiple processes. For example, the interconnects in interconnect layer 920 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 9B can be collectively referred to as interconnect layer 920.

Method 1600 proceeds to operation 1606, as illustrated in FIG. 16A, in which a first bonding layer is formed above the first interconnect layer. The first bonding layer can include a plurality of first bonding contacts. As illustrated in FIG. 9B, a bonding layer 922 is formed above interconnect layer 920. Bonding layer 922 can include a plurality of bonding contacts 924 surrounded by dielectrics. In some embodiments, a dielectric layer is deposited on the top surface of interconnect layer 920 by one or more thin film deposition processes including, but not limited to, CVD, PVD, ALD, or any combination thereof. Bonding contacts 924 then can be formed through the dielectric layer and in contact with the interconnects in interconnect layer 920 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1608, as illustrated in FIG. 16A, in which the first wafer is diced into a plurality of first dies, such that at least one of the first dies includes at least one of the first semiconductor structures. As illustrated in FIG. 12B, first wafer 1202 (as shown in FIG. 12A) is diced into a plurality of dies 1214, such that at least one die 1214 includes first semiconductor structure 1204. In some embodiments, each shot of first wafer 1202 is cut along the scribing lines using wafer laser dicing and/or mechanical dicing techniques, thereby becoming respective die 1214. Die 1214 includes first semiconductor structure 1204, for example, the structure as shown in FIG. 9B.

Method 1600 proceeds to operation 1610, as illustrated in FIG. 16A, in which a plurality of second semiconductor structures are formed on a second wafer. At least one of the second semiconductor structures includes an array of DRAM cells and a second bonding layer including a plurality of second bonding contacts. The second wafer can be a silicon wafer. In some embodiments, to form the plurality of second semiconductor structures, the array of DRAM cells is formed on the second wafer. In some embodiments, to form the array of DRAM cells, a plurality of transistors are formed on the second wafer and a plurality of capacitors are formed above and in contact with at least some of the transistors. In some embodiments, to form the plurality of second semiconductor structures, a peripheral circuit of the array of DRAM cells is also formed on the second wafer.

As illustrated in FIG. 12A, a plurality of second semiconductor structures 1208 are formed on a second wafer 1206. Second wafer 1206 can include a plurality of shots separated by scribing lines. Each shot of second wafer 1206 includes one or more second semiconductor structures 1208, according to some embodiments. FIGS. 10A-10C illustrate one example of the formation of second semiconductor structure 1208.

As illustrated in FIG. 10A, a plurality of transistors 1004 are formed on a silicon substrate 1002 (as part of second wafer 1206, e.g., a silicon wafer). Transistors 1004 can be formed by a plurality of processes including, but not limited to, photolithography, dry/wet etch, thin film deposition, thermal growth, implantation, CMP, and any other suitable processes. In some embodiments, doped regions are formed in silicon substrate 1002 by ion implantation and/or thermal diffusion, which function, for example, as source and/or drain regions of transistors 1004. In some embodiments, isolation regions (e.g., STIs) are also formed in silicon substrate 1002 by wet/dry etch and thin film deposition.

As illustrated in FIG. 10B, a plurality of capacitors 1006 are formed above and in contact with transistors 1004, i.e., DRAM selection transistors 1004. Each capacitor 1006 can be patterned by photography to be aligned with respective DRAM selection transistor 1004 to form a 1T1C memory cell, for example, by electrically connecting one electrode of capacitor 1006 with one node of respective DRAM selection transistor 1004. In some embodiments, bit lines 1007 and common plates 1009 are formed as well for electrically connecting DRAM selection transistors 1004 and capacitors 1006. Capacitors 1006 can be formed by a plurality of processes including, but not limited to, photolithography, dry/wet etch, thin film deposition, thermal growth, implantation, CMP, and any other suitable processes. An array of DRAM cells 1008 (each having DRAM selection transistor 1004 and capacitor 1006) are thereby formed.

Method 1600 proceeds to operation 1612, as illustrated in FIG. 16A, in which a second interconnect layer is formed above the array of DRAM cells. The second interconnect layer can include a second plurality of interconnects in one or more ILD layers. As illustrated in FIG. 10C, an interconnect layer 1014 can be formed above array of DRAM cells 1008. Interconnect layer 1014 can include interconnects of MEOL and/or BEOL in a plurality of ILD layers to make electrical connections with array of DRAM cells 1008. In some embodiments, interconnect layer 1014 includes multiple ILD layers and interconnects therein formed in multiple processes. For example, the interconnects in interconnect layers 1014 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10C can be collectively referred to as interconnect layer 1014.

Method 1600 proceeds to operation 1614, as illustrated in FIG. 16A, in which a second bonding layer is formed above the second interconnect layer. The second bonding layer can include a plurality of second bonding contacts. As illustrated in FIG. 10C, a bonding layer 1016 is formed above interconnect layer 1014. Bonding layer 1016 can include a plurality of bonding contacts 1018 surrounded by dielectrics. In some embodiments, a dielectric layer is deposited on the top surface of interconnect layer 1014 by one or more thin film deposition processes including, but not limited to, CVD, PVD, ALD, or any combination thereof. Bonding contacts 1018 then can be formed through the dielectric layer and in contact with the interconnects in interconnect layer 1014 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1616, as illustrated in FIG. 16A, in which the second wafer is diced into a plurality of second dies, such that at least one of the second dies includes the at least one of the second semiconductor structures. As illustrated in FIG. 12B, second wafer 1206 (as shown in FIG. 12A) is diced into a plurality of dies 1216, such that at least one die 1216 includes second semiconductor structure 1208. In some embodiments, each shot of second wafer 1206 is cut from second wafer 1206 along the scribing lines using wafer laser dicing and/or mechanical dicing techniques, thereby becoming respective die 1216.

Die 1216 includes second semiconductor structure 1208, for example, the structure as shown in FIG. 10C.

Method 1600 proceeds to operation 1618, as illustrated in FIG. 16B, in which a plurality of third semiconductor structures are formed on a third wafer. At least one of the third semiconductor structures includes a processor, an array of SRAM cells, and a third bonding layer including a plurality of third bonding contacts. The third wafer can be a silicon wafer. In some embodiments, to form the plurality of third semiconductor structures, the processor and the array of SRAM cells are formed on the third wafer. In some embodiments, to form the processor and the array of SRAM cells, a plurality of transistors are formed on the third wafer. In some embodiments, to form the plurality of third semiconductor structures, a peripheral circuit of at least one of the array of NAND memory cells or the array of DRAM cells is also formed on the third wafer.

As illustrated in FIG. 12A, a plurality of third semiconductor structures 1212 are formed on a third wafer 1210. Third wafer 1210 can include a plurality of shots separated by scribing lines. Each shot of third wafer 1210 includes one or more third semiconductor structures 1212, according to some embodiments. FIGS. 8A and 8B illustrate one example of the formation of third semiconductor structure 1212.

As illustrated in FIG. 8A, a plurality of transistors 804 are formed on a silicon substrate 802 (as part of third wafer 1210, e.g., a silicon wafer) by a plurality of processes including, but not limited to, photolithography, dry/wet etch, thin film deposition, thermal growth, implantation, CMP, and any other suitable processes. In some embodiments, doped regions are formed in silicon substrate 802 by ion implantation and/or thermal diffusion, which function, for example, as source regions and/or drain regions of transistors 804. In some embodiments, isolation regions (e.g., STIs) are also formed in silicon substrate 802 by wet/dry etch and thin film deposition. Transistors 804 can form a device layer 806 on silicon substrate 802. In some embodiments, device layer 806 includes a processor 808, an array of SRAM cells 810, and a peripheral circuit 812.

Method 1600 proceeds to operation 1620, as illustrated in FIG. 16B, in which a third interconnect layer is formed above the processor and SRAM arrays. The third interconnect layer can include a third plurality of interconnects in one or more ILD layers. As illustrated in FIG. 8B, an interconnect layer 814 can be formed above device layer 806 including processor 808 and array of SRAM cells 810. Interconnect layer 814 can include interconnects of MEOL and/or BEOL in a plurality of ILD layers to make electrical connections with device layer 806. In some embodiments, interconnect layer 814 includes multiple ILD layers and interconnects therein formed in multiple processes. For example, the interconnects in interconnect layer 814 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 8B can be collectively referred to as interconnect layer 814.

Method 1600 proceeds to operation 1622, as illustrated in FIG. 16B, in which a third bonding layer is formed above the third interconnect layer. The third bonding layer can include a plurality of third bonding contacts. As illustrated in FIG. 8B, a bonding layer 816 is formed above interconnect layer 814. Bonding layer 816 can include a plurality of bonding contacts 818 surrounded by dielectrics. In some embodiments, a dielectric layer is deposited on the top surface of interconnect layer 814 by one or more thin film deposition processes including, but not limited to, CVD, PVD, ALD, or any combination thereof. Bonding contacts 818 then can be formed through the dielectric layer and in contact with the interconnects in interconnect layer 814 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1600 proceeds to operation 1624, as illustrated in FIG. 16B, in which the third wafer is diced into a plurality of third dies, such that at least one of the third dies includes the at least one of the third semiconductor structures. As illustrated in FIG. 12B, third wafer 1210 (as shown in FIG. 12A) is diced into a plurality of dies 1218, such that at least one die 1218 includes second semiconductor structure 1212. In some embodiments, each shot of third wafer 1210 is cut from third wafer 1210 along the scribing lines using wafer laser dicing and/or mechanical dicing techniques, thereby becoming respective die 1218. Die 1218 includes second semiconductor structure 1212, for example, the structure as shown in FIG. 8B.

Method 1600 proceeds to operation 1626, as illustrated in FIG. 16B, in which the third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface, and the second bonding contacts are in contact with a second set of the third bonding contacts at a second bonding interface. The bonding can be hybrid bonding. In some embodiments, the third semiconductor structure is above the first semiconductor structure and the second semiconductor structure after the bonding. In some embodiments, the third semiconductor structure is below the first semiconductor structure and the second semiconductor structure after the bonding.

As illustrated in FIG. 12C, die 1218 and each of dies 1214 and 1216 are bonded in a face-to-face manner, such that third semiconductor structures 1212 is bonded to first semiconductor structure 1204 at a first bonding interface 1220 and bonded to second semiconductor structure 1208 at a second bonding interface 1222. First and second bonding interfaces 1220 and 1222 can be in the same plane. Although third semiconductor structure 1212 is below first and second semiconductor structures 1204 and 1208 after the bonding as shown in FIG. 12C, it is understood that third semiconductor structure 1212 may be above first and second semiconductor structures 1204 and 1208 after bonding in some embodiments. FIG. 11A illustrates an example of bonding first, second, and third semiconductor structures 1204, 1208, and 1212.

As illustrated in FIG. 11A, silicon substrate 902 and components formed thereon (e.g., memory stack 904 and array of 3D NAND memory strings 910 formed therethrough) are flipped upside down. Bonding layer 922 facing down is bonded with bonding layer 816 facing up, i.e., in a face-to-face manner, thereby forming a first bonding interface 1102 (as shown in FIG. 11B). Similarly, silicon substrate 1002 and components formed thereon (e.g., DRAM cells 1012) are flipped upside down. Bonding layer 1016 facing down is bonded with bonding layer 816 facing up, i.e., in a face-to-face manner as well, thereby forming a second bonding interface 1104 (as shown in FIG. 11B). That is, silicon substrates 902 and 1002 and components formed thereon can be bonded with silicon substrate 802 and components formed thereon in a face-to-face manner next to one another, such that first and second bonding interfaces 1102 and 1104 are flush with one another and in the same plane. In some embodiments, a treatment process, e.g., plasma treatment, wet treatment and/or thermal treatment, is applied to bonding surfaces prior to bonding. Although not shown in FIG. 11A, silicon substrate 802 and components formed thereon (e.g., device layer 806 including processor 808, array of SRAM cells 810, and peripheral circuit 812) can be flipped upside down, and bonding layer 816 facing down can be bonded with each of bonding layers 922 and 1016 facing up, i.e., in a face-to-face manner, thereby forming first and second bonding interfaces 1102 and 1104.

After the bonding, bonding contacts 924 in bonding layer 922 and some bonding contacts 818 in bonding layer 816 (a first set of bonding contacts 818 directly below silicon substrate 902) are aligned and in contact with one another, such that memory stack 904 and array of 3D NAND memory strings 910 formed therethrough can be electrically connected to device layer 806 (e.g., processor 808, array of SRAM cells 810, and peripheral circuit 812 therein). Similarly, after the bonding, bonding contacts 1018 in bonding layer 1016 and some bonding contacts 818 in bonding layer 816 (a second set of bonding contacts 818 directly below substrate 1002) are aligned and in contact with one another, such that array of DRAM cells 1012 can be electrically connected to device layer 806 (e.g., processor 808, array of SRAM cells 810, and peripheral circuit 812 therein). It is understood that in the bonded chip, device layer 806 (e.g., processor 808, array of SRAM cells 810, and peripheral circuit 812 therein) may be either above or below memory stack 904, array of 3D NAND memory strings 910, and array of DRAM cells 1012. Nevertheless, first and second bonding interfaces 1102 and 1104 can be formed between device layer 806 (e.g., processor 808, array of SRAM cells 810, and peripheral circuit 812 therein) and memory stack 904 (and array of 3D NAND memory strings 910 formed therethrough) and array of DRAM cells 1012 after the bonding as illustrated in FIG. 11B.

Method 1600 proceeds to operation 1628, as illustrated in FIG. 16B, in which the third wafer or each of the first and second wafers is thinned to form semiconductor layer(s). In some embodiments, the third wafer of the third semiconductor structure, which is above the first wafer of the first semiconductor structure and the second wafer of the second semiconductor structure after the bonding, is thinned to form the semiconductor layer. In some embodiments, the first wafer of the first semiconductor structure and the second wafer of the second semiconductor structure, which are above the third wafer of the third semiconductor structure after the bonding, are thinned to form first and second semiconductor layers, respectively.

As illustrated in FIG. 11B, silicon substrate 902 at the top of the bonded chip (as shown in FIG. 11A) is thinned, so that the thinned top substrate can serve as a first semiconductor layer 1106, for example, a single-crystal silicon layer or a polysilicon layer. Similarly, silicon substrate 1002 at the top of the bonded chip (as shown in FIG. 11A) is thinned, so that the thinned top substrate can serve as a second semiconductor layer 1108, for example, a single-crystal silicon layer. The thickness of the thinned substrate can be between about 200 nm and about 5 µm, such as between 200 nm and 5 µm, or between about 150 nm and about 50 µm, such as between 150 nm and 50 µm. Silicon substrates 902 and 1002 can be thinned by processes including, but not limited to, wafer grinding, dry etch, wet etch, CMP, any other suitable processes, or any combination thereof. It is understood that in some embodiments, first and second semiconductor layers 1106 and 1108 may be a single, continuous semiconductor layer. It is also understood that in some embodiments, another single, continuous semiconductor layer may be formed on first and second semiconductor layers 1106 and 1108. It is further understood that when silicon substrate 802 is the substrate at the top of the bonded chip, another semiconductor layer may be formed by thinning silicon substrate 802.

Method 1600 proceeds to operation 1630, as illustrated in FIG. 16B, in which a pad-out interconnect layer is formed above the semiconductor layer. As illustrated in FIG. 11B, a first pad-out interconnect layer 1110 is formed above first semiconductor layer 1106, and a second pad-out interconnect layer 1112 is formed above second semiconductor layer 1108. Pad-out interconnect layers 1110 and 1112 can include interconnects, such as pad contacts 1114 and 1116, formed in one or more ILD layers. Pad contacts 1114 and 1116 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 1118 and 1120 are formed extending vertically through first and second semiconductor layers 1106 and 1108, respectively, for example by wet/dry etch followed by depositing conductive materials. Contacts 1118 and 1120 can be in contact with interconnects in first and second pad-out interconnect layers 1110 and 1112, respectively.

Figure 13A:
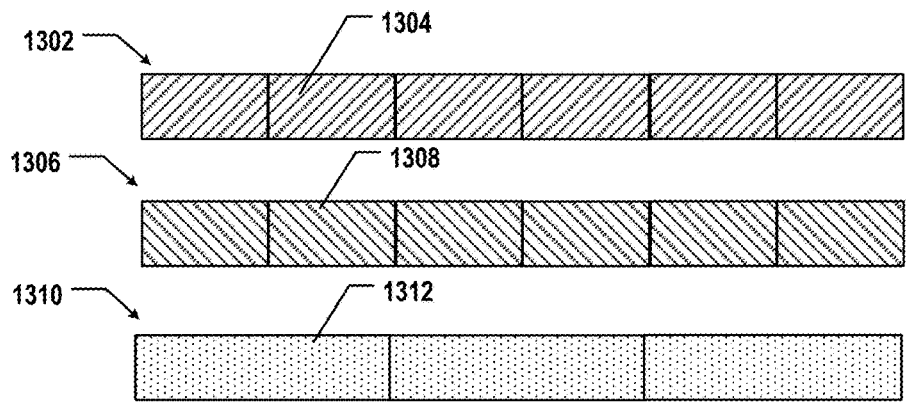
FIGS. 13A-13D illustrate a fabrication process for bonding and dicing an exemplary semiconductor structure, according to some embodiments.

Instead of the packaging scheme based on die-to-die bonding after dicing as described above with respect to FIGS. 12A-12C, 16A, and 16B, FIGS. 13A-13D, 17A, and 17B illustrate another packaging scheme based on die-to-wafer bonding, according to some embodiments. Operations 1602, 1604, 1606, 1608, 1610, 1612, 1614, 1616, 1618, 1620, and 1622 of method 1700 in FIGS. 17A and 17B are described above with respect to method 1600 in FIGS. 16A and 16B and thus, are not repeated. As illustrated in FIG. 13A, a plurality of first semiconductor structures 1304 are formed on a first wafer 1302. First wafer 1302 can include a plurality of shots separated by scribing lines. Each shot of first wafer 1302 includes one or more first semiconductor structures 1304, according to some embodiments. FIGS. 9A and 9B illustrate one example of the formation of first semiconductor structure 1304. Similarly, a plurality of second semiconductor structures 1308 are formed on a second wafer 1306. Second wafer 1306 can include a plurality of shots separated by scribing lines. Each shot of second wafer 1306 includes one or more second semiconductor structures 1308, according to some embodiments. FIGS. 10A-10C illustrate one example of the formation of second semiconductor structure 1308. Similarly, a plurality of third semiconductor structures 1312 are formed on a third wafer 1310. Third wafer 1310 can include a plurality of shots separated by scribing lines. Each shot of third wafer 1310 includes one or more third semiconductor structures 1312, according to some embodiments. FIGS. 8A and 8B illustrate one example of the formation of third semiconductor structure 1312.

Figure 13B:
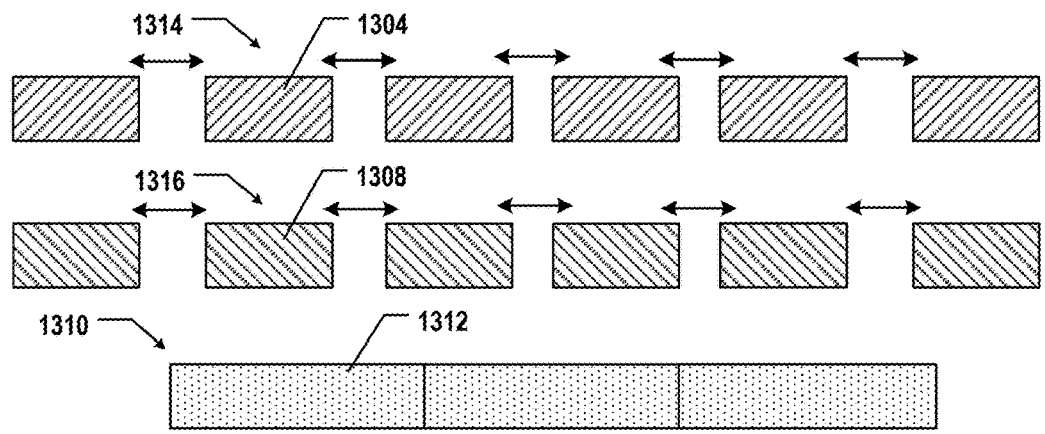

As illustrated in FIG. 13B, first wafer 1302 (as shown in FIG. 13A) is diced into a plurality of dies 1314, such that at least one die 1314 includes first semiconductor structure 1304. In some embodiments, each shot of first wafer 1302 is cut from first wafer 1302 along the scribing lines using wafer laser dicing and/or mechanical dicing techniques, thereby becoming respective die 1314. Die 1314 includes first semiconductor structure 1304, for example, the structure as shown in FIG. 9B. Similarly, second wafer 1306 (as shown in FIG. 13A) is diced into a plurality of dies 1316, such that at least one die 1316 includes second semiconductor structure 1308. In some embodiments, each shot of second wafer 1306 is cut from second wafer 1306 along the scribing lines using wafer laser dicing and/or mechanical dicing techniques, thereby becoming respective die 1316. Die 1316 includes second semiconductor structure 1308, for example, the structure as shown in FIG. 10C.

Method 1700 proceeds to operation 1702, as illustrated in FIG. 17B, in which the third wafer and each of the at least one first die and the at least one second die are bonded in a face-to-face manner to form a bonded structure, such that at least one third semiconductor structure is bonded to each of the first semiconductor structure and the second semiconductor structure. The first bonding contacts are in contact with a first set of the third bonding contacts at a first bonding interface, and the second bonding contacts are in contact with a second set of the third bonding contacts at a second bonding interface.

Figure 13C:
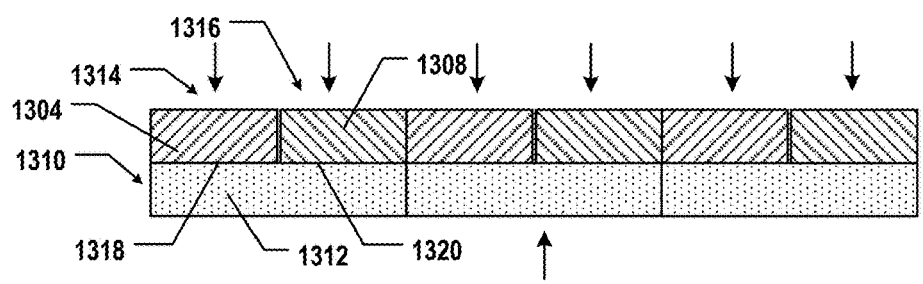

As illustrated in FIG. 13C, third wafer 1310 and each of die 1314 including first semiconductor structure 1304 and die 1316 including second semiconductor structure 1308 are bonded in a face-to-face manner, such that first semiconductor structure 1304 is bonded to third semiconductor structure 1312 at a first bonding interface 1318 and second semiconductor structure 1308 is bonded to third semiconductor structure 1312 at a second bonding interface 1320. Although first semiconductor structure 1304 and second semiconductor structure 1308 are above third semiconductor structure 1312 after bonding as shown in FIG. 13C, it is understood that third semiconductor structure 1312 may be above first semiconductor structure 1304 and second semiconductor structure 1308 after the bonding in some embodiments. FIG. 11A illustrates one example of the formation of bonded first, second, and third semiconductor structures 1304, 1308, and 1312.

Method 1700 proceeds to operation 1704, as illustrated in FIG. 17B, in which the third wafer or each of the first and second wafers is thinned to form semiconductor layer(s). In some embodiments, the third wafer of the third semiconductor structure, which is above the first wafer of the first semiconductor structure and the second wafer of the second semiconductor structure after the bonding, is thinned to form the semiconductor layer. In some embodiments, the first wafer of the first semiconductor structure and the second wafer of the second semiconductor structure, which are above the third wafer of the third semiconductor structure after the bonding, is thinned to form first and second semiconductor layers, respectively.

As illustrated in FIG. 11B, silicon substrate 902 at the top of the bonded chip (as shown in FIG. 11A) is thinned, so that the thinned top substrate can serve as a first semiconductor layer 1106, for example, a single-crystal silicon layer or a polysilicon layer. Similarly, silicon substrate 1002 at the top of the bonded chip (as shown in FIG. 11A) is thinned, so that the thinned top substrate can serve as a second semiconductor layer 1108, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrates 902 and 1002 can be thinned by processes including, but not limited to, wafer grinding, dry etch, wet etch, CMP, any other suitable processes, or any combination thereof. It is understood that in some embodiments, first and second semiconductor layers 1106 and 1108 may be a single, continuous semiconductor layer. It is also understood that in some embodiments, another single, continuous semiconductor layer may be formed on first and second semiconductor layers 1106 and 1108. It is further understood that when silicon substrate 802 is the substrate at the top of the bonded chip, another semiconductor layer may be formed by thinning silicon substrate 802.

Method 1700 proceeds to operation 1706, as illustrated in FIG. 17B, in which a pad-out interconnect layer is formed above the semiconductor layer. As illustrated in FIG. 11B, a first pad-out interconnect layer 1110 is formed above first semiconductor layer 1106, and a second pad-out interconnect layer 1112 is formed above second semiconductor layer 1108. Pad-out interconnect layers 1110 and 1112 can include interconnects, such as pad contacts 1114 and 1116, formed in one or more ILD layers. Pad contacts 1114 and 1116 can include conductive materials including, but not limited to W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after bonding and thinning, contacts 1118 and 1120 are formed extending vertically through first and second semiconductor layers 1106 and 1108, respectively, for example by wet/dry etch followed by depositing conductive materials. Contacts 1118 and 1120 can be in contact with interconnects in first and second pad-out interconnect layers 1110 and 1112, respectively.

Figure 13D:
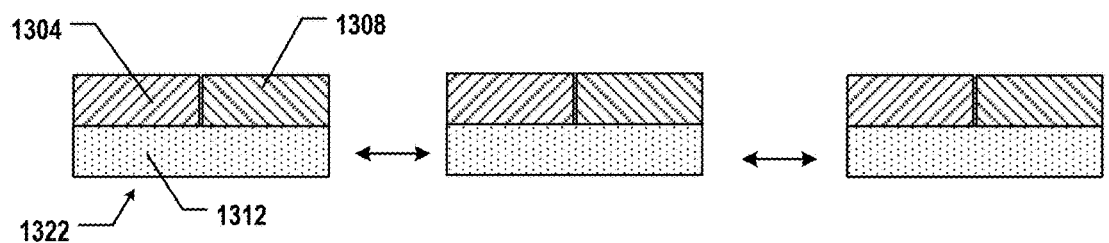

Method 1700 proceeds to operation 1708, as illustrated in FIG. 17B, in which the bonded structure is diced into a plurality of dies. At least one of the dies includes the bonded first, second, and third semiconductor structures. As illustrated in FIG. 13D, the bonded structure (as shown in FIG. 13C) is diced into a plurality of dies 1322. At least one of dies 1322 includes bonded first, second, and third semiconductor structures 1304, 1308, and 1312. In some embodiments, each shot of the bonded structure is cut from the bonded structure along the scribing lines using wafer laser dicing and/or mechanical dicing techniques, thereby becoming respective die 1322. Die 1322 can include bonded first, second, and third semiconductor structures 1304, 1308, and 1312, for example, the bonded structure as shown in FIG. 11B.

Figure 14:
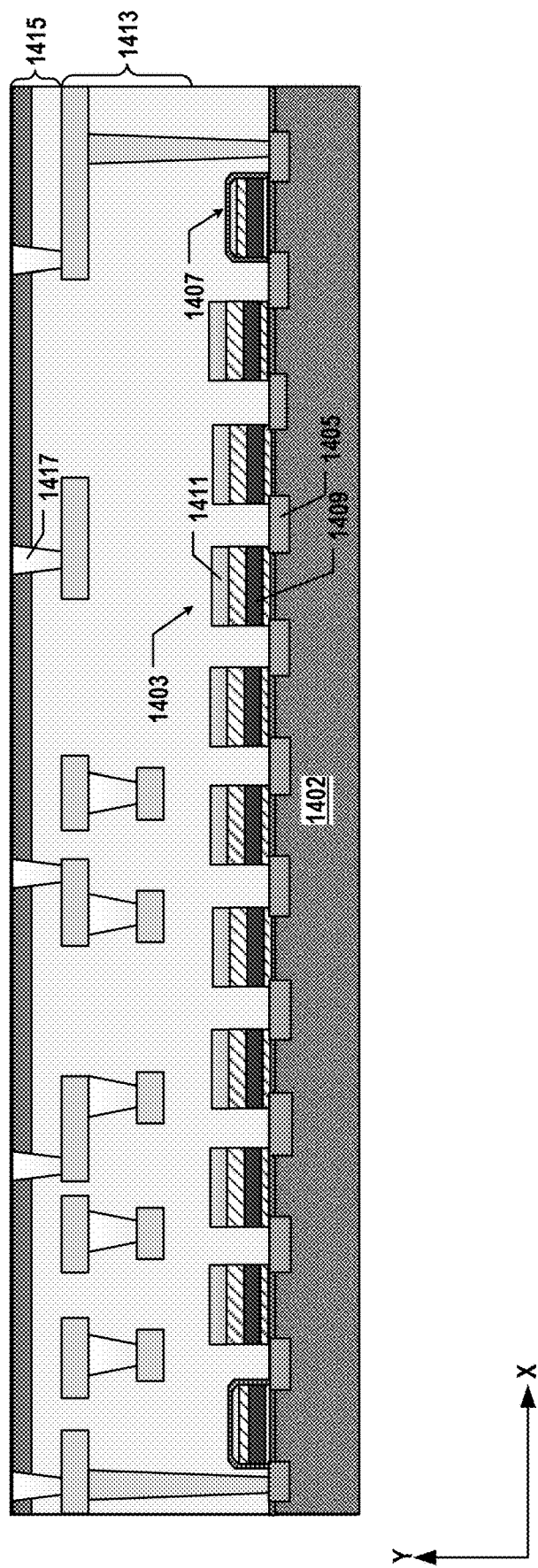
FIG. 14 illustrates a cross-section of an exemplary semiconductor structure having 2D NAND memory cells, according to some embodiments.

It is understood that the NAND memory disclosed herein may include an array of 2D NAND memory cells in addition to or instead of an array of 3D NAND memory strings in some embodiments. FIG. 14 illustrates a cross-section of an exemplary semiconductor structure 1400 having 2D NAND memory cells, according to some embodiments. Semiconductor structure 1400 includes a NAND flash memory device in which memory cells are provided in the form of an array of 2D NAND memory cells 1403 on a substrate 1402. Array of 2D NAND memory cells 1403 can include a plurality of 2D NAND memory strings, each of which includes a plurality of memory cells connected in series by sources/drains 1405 (resembling a NAND gate) and two select transistors 1407 at the ends of the 2D NAND memory string, respectively. In some embodiments, each 2D NAND memory cell 1403 includes a floating-gate transistor having a floating gate 1409 and a control gate 1411 stacked vertically. In some embodiments, the floating-gate transistor further includes dielectric layers, such as a blocking layer disposed vertically between control gate 1411 and floating gate 1409 and a tunneling layer disposed below floating gate 1409. Channels can be formed laterally between sources/drains 1405 and below the gate stacks (including the tunneling layer, floating gate 1409, the blocking layer, and control gate 1411). Each channel is controlled by the voltage signal applied to the respective gate stack through control gate 1411, according to some embodiments. It is understood that 2D NAND memory cell 1403 may include a charge-trap transistor, which replaces floating gate 1409 with a storage layer.

In some embodiments, semiconductor structure 1400 also includes an interconnect layer 1413 above array of 2D NAND memory cells 1403 to transfer electrical signals to and from array of 2D NAND memory cells 1403. Interconnect layer 1413 can include a plurality of interconnects, including interconnect lines and via contacts. In some embodiments, interconnects in interconnect layer 1413 also include local interconnects, such as bit line contacts and word line contacts. In some embodiments, semiconductor structure 1400 further includes a bonding layer 1415 above interconnect layer 1413 and array of 2D NAND memory cells 1403. Bonding layer 1415 can include a plurality of bonding contacts 1417 and dielectrics surrounding and electrically isolating bonding contacts 1417.

It is understood that although the third semiconductor structures disclosed above in which a processor and SRAM are formed (e.g., 706 and 707) each includes the peripheral circuits of the NAND memory and/or the DRAM (e.g., 720 and 759), in some embodiments, the entirety or part of the peripheral circuits may not be included in the third semiconductor structure in the bonded semiconductor device. It is also understood that although the first semiconductor structures disclosed above in which NAND memory is formed (e.g., 702 and 703) each does not include the peripheral circuits of the NAND memory, in some embodiments, the entirety or part of the peripheral circuits may be included in the first semiconductor structure in the bonded semiconductor device. It is further understood that although the second semiconductor structures disclosed above in which DRAM is formed (e.g., 704 and 705) each does not include the peripheral circuits of the DRAM, in some embodiments, the entirety or part of the peripheral circuits may be included in the second semiconductor structure in the bonded semiconductor device.

Figure 15A:
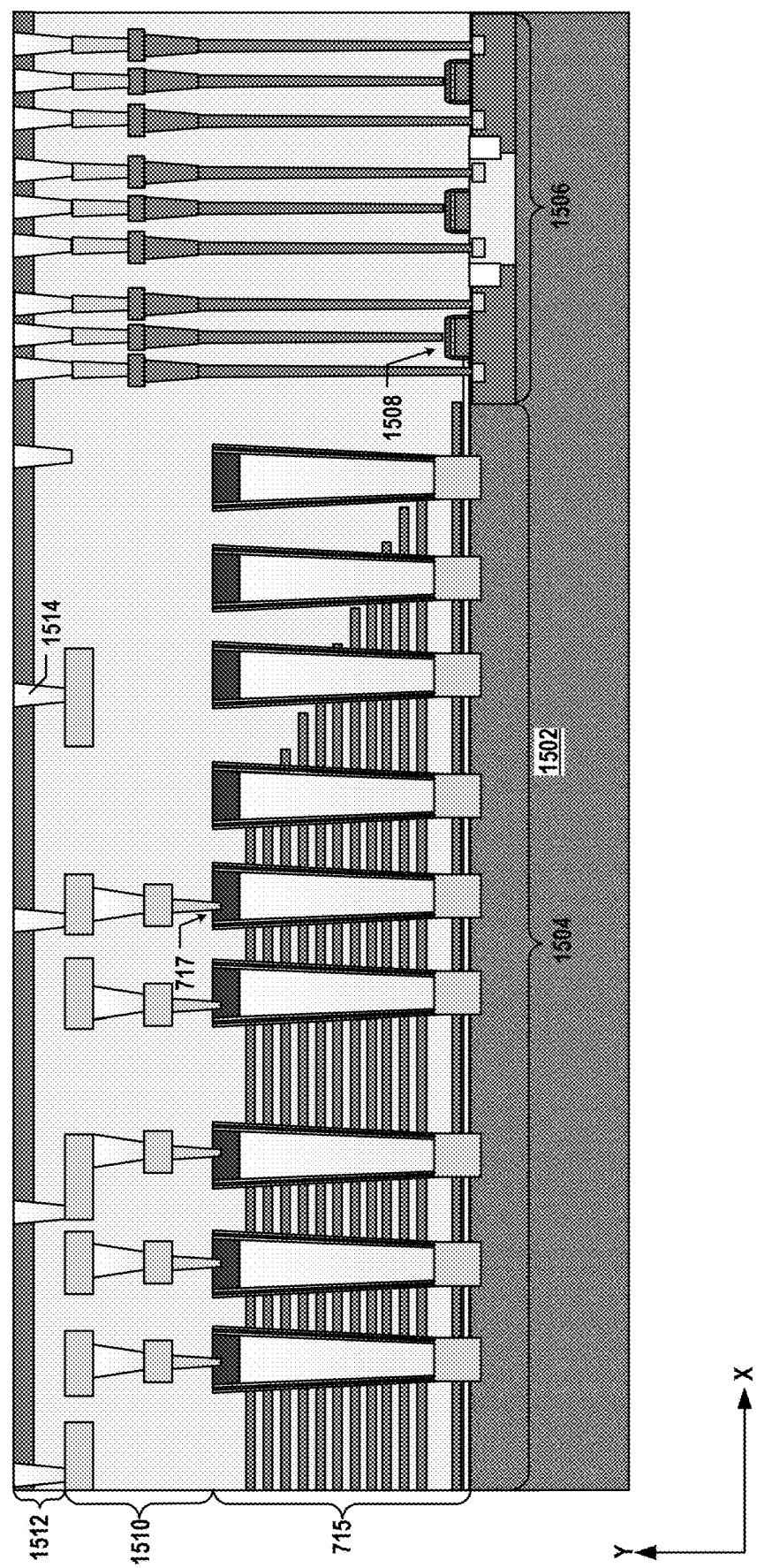
FIG. 15A illustrates a cross-section of an exemplary semiconductor structure having NAND memory and peripheral circuits, according to some embodiments.

FIG. 15A illustrates a cross-section of an exemplary semiconductor structure 1500 having NAND memory and peripheral circuits, according to some embodiments. For illustrative purpose only, a NAND memory 1504 in semiconductor structure 1500 includes array of 3D NAND memory strings 717 extending vertically through memory stack 715 above a substrate 1502 as described above in detail in first semiconductor structure 703 with respect to FIG. 7B. The details of similar structures (e.g., materials, fabrication process, functions, etc.) in both semiconductor structures 703 and 1500 are not repeated. It is understood that NAND memory 1504 may include an array of 2D NAND memory cells (e.g., 1403) in other embodiments.

As illustrated in FIG. 15A, semiconductor structure 1500 further includes a peripheral circuit 1506 formed on substrate 1502 and outside of NAND memory 1504 (e.g., array of 3D NAND memory strings 717). Both NAND memory 1504 and peripheral circuit 1506 of NAND memory 1504 can be formed in the same plane, e.g., on substrate 1502. Peripheral circuit 1506 can be the entirety or part of the peripheral circuits for sensing and controlling NAND memory 1504, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1506 includes a plurality of transistors 1508. Transistors 1508 can be formed "on" substrate 1502, in which the entirety or part of transistors 1508 are formed in substrate 1502 (e.g., below the top surface of substrate 1502) and/or directly on substrate 1502. Isolation regions (e.g., STIs) and doped regions (e.g., source regions and drain regions of transistors 1508) can be formed in substrate 1502 as well. Transistors 1508 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, semiconductor structure 1500 also includes an interconnect layer 1510 above NAND memory 1504 (e.g., memory stack 715, 3D NAND memory strings 717) and peripheral circuit 1506 to transfer electrical signals to and from 3D NAND memory strings 717 and peripheral circuit 1506. Interconnect layer 1510 can include a plurality of interconnects, including interconnect lines and via contacts. NAND memory 1504 (e.g., 3D NAND memory strings 717) and peripheral circuit 1506 can be electrically connected by interconnects in interconnect layer 1510 as well. In some embodiments, semiconductor structure 1500 further includes a bonding layer 1512 above interconnect layer 1510, memory stack 715 (and 3D NAND memory strings 717 therethrough), and peripheral circuit 1506. Bonding layer 1512 can include a plurality of bonding contacts 1514 and dielectrics surrounding and electrically isolating bonding contacts 1514.

Figure 15B:
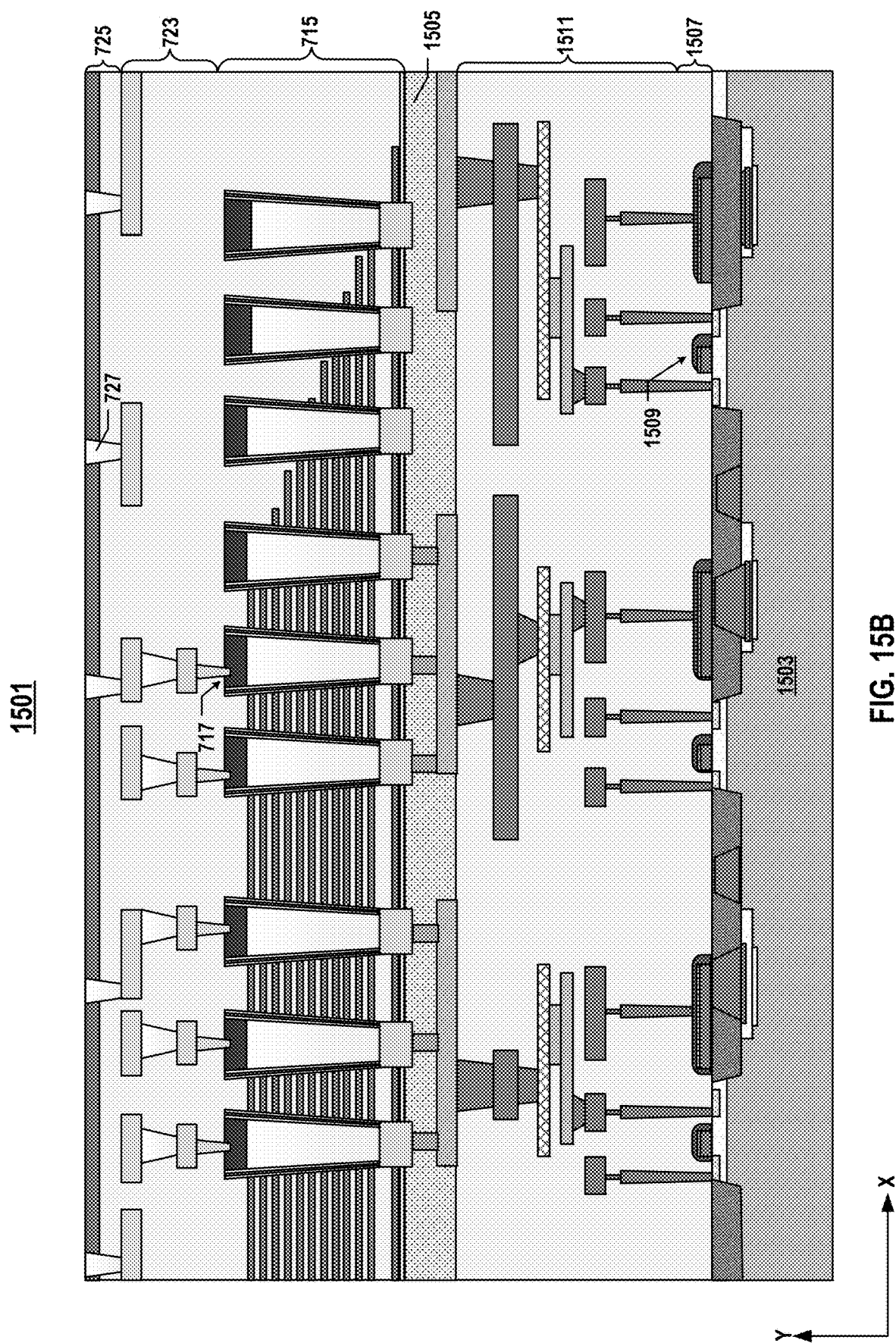
FIG. 15B illustrates a cross-section of another exemplary semiconductor structure having NAND memory and peripheral circuits, according to some embodiments.

The relative positions of the NAND memory and the peripheral circuit of the NAND memory in the same semiconductor structure are not limited to being in the same plane as shown in FIG. 15A. In some embodiments, the peripheral circuit of the NAND memory is above the NAND memory. In some embodiments, the peripheral circuit of the NAND memory is below the NAND memory. FIG. 15B illustrates a cross-section of another exemplary semiconductor structure 1501 having NAND memory and peripheral circuits, according to some embodiments. Semiconductor structure 1501 is similar to semiconductor structure 703, both of which include memory stack 715, array of 3D NAND memory strings 717, interconnect layer 723 above memory stack 715, and bonding layer 725 above interconnect layer 723. The details of similar structures (e.g., materials, fabrication process, functions, etc.) in both semiconductor structures 703 and 1501 are thus not repeated.

Different from semiconductor structure 703, semiconductor structure 1501 further includes a peripheral circuit 1507 below memory stack 715 (and 3D NAND memory strings 717 therethrough) on a substrate 1503. Peripheral circuit 1507 can be the entirety or part of the peripheral circuits for sensing and controlling 3D NAND memory strings 717, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1507 includes a plurality of transistors 1509. Transistors 1509 can be formed "on" substrate 1503, in which the entirety or part of transistors

1509 are formed in substrate 1503 (e.g., below the top surface of substrate 1503) and/or directly on substrate 1503. Isolation regions (e.g., STIs) and doped regions (e.g., source regions and drain regions of transistors 1509) can be formed in substrate 1503 as well. Transistors 1509 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, semiconductor structure 1501 also includes an interconnect layer 1511 formed vertically between peripheral circuit 1507 and memory stack 715 (and 3D NAND memory strings 717 therethrough) to electrically connect 3D NAND memory strings 717 and peripheral circuit 1507 for transferring electrical signals between 3D NAND memory strings 717 and peripheral circuit 1507. Interconnect layer 1511 can include a plurality of interconnects, including interconnect lines and via contacts. 3D NAND memory strings 717 and peripheral circuit 1507 can be electrically connected by the interconnects in interconnect layer 1511 as well. In some embodiments, semiconductor structure 1501 further includes a semiconductor layer 1505 above which memory stack 715 (and 3D NAND memory strings 717 therethrough) can be formed. Semiconductor layer 1505 can be a polysilicon layer formed above interconnect layer 1511, for example, by one or more thin film deposition processes. Memory stack 715 then can be formed above semiconductor layer 1505. It is understood that although peripheral circuit 1507 is below memory stack 715 (and 3D NAND memory strings 717 therethrough) as shown in FIG. 15B, in some embodiments, peripheral circuit 1507 may be above memory stack 715 (and 3D NAND memory strings 717 therethrough).

Although semiconductor structures 1500 and 1501 in FIGS. 15A and 15B include NAND flash memory, it is understood that semiconductor structures including DRAM may have similar configurations as semiconductor structures 1500 and 1501. For example, semiconductor structure including DRAM as disclosed herein (e.g., 704 and 705) may include the entirety or part of the peripheral circuits of DRAM cells as well. The peripheral circuit of DRAM cells can be in the same plane as the DRAM cells (e.g., outside of the DRAM cell array), above the DRAM cell array, and/or below the DRAM cell array.

According to one aspect of the present disclosure, a semiconductor device includes an array of NAND memory cells and a first bonding layer including a plurality of first bonding contacts. The semiconductor device also includes a second semiconductor structure including an array of DRAM cells and a second bonding layer including a plurality of second bonding contacts. The semiconductor device also includes a third semiconductor structure including a processor, an array of SRAM cells, and a third bonding layer including a plurality of third bonding contacts. The semiconductor device further includes a first bonding interface between the first bonding layer and the third bonding layer, and a second bonding interface between the second bonding layer and the third bonding layer. The first bonding contacts are in contact with a first set of the third bonding contacts at the first bonding interface. The second bonding contacts are in contact with a second set of the third bonding contacts at the second bonding interface. The first bonding interface and the second bonding interface are in a same plane.

In some embodiments, the third semiconductor structure includes a substrate, the processor on the substrate, the array of SRAM cells on the substrate and outside of the processor, and the third bonding layer above the processor and the array of SRAM cells.

In some embodiments, the first semiconductor structure includes the first bonding layer above the third bonding layer, the array of NAND memory cells above the first bonding layer, and a first semiconductor layer above and in contact with the array of NAND memory cells. In some embodiments, the array of NAND memory cells includes at least one of a 3D NAND memory string or a 2D NAND memory cell.

In some embodiments, the semiconductor structure further includes a first pad-out interconnect layer above the first semiconductor layer. In some embodiments, the first semiconductor layer includes single-crystal silicon. In some embodiments, the first semiconductor layer includes polysilicon.

In some embodiments, the second semiconductor structure includes the second bonding layer above the third bonding layer, DRAM cell arrays above the second bonding layer, and a second semiconductor layer above and in contact with DRAM cell arrays.

In some embodiments, the semiconductor structure further includes a second pad-out interconnect layer above the second semiconductor layer. In some embodiments, the second semiconductor layer includes single-crystal silicon.

In some embodiments, the first semiconductor structure includes a first substrate, the array of NAND memory cells on the first substrate, and the first bonding layer above the array of NAND memory cells. In some embodiments, the array of NAND memory cells includes at least one of a 3D NAND memory string or a 2D NAND memory cell.

In some embodiments, the second semiconductor structure includes a second substrate, the array of DRAM cells on the second substrate, and the second bonding layer above the array of DRAM cells.

In some embodiments, the third semiconductor structure includes the third bonding layer above the first bonding layer and the second bonding layer, the processor above the third bonding layer, the array of SRAM cells above the third bonding layer and outside of the processor, and a third semiconductor layer above and in contact with the processor and the array of SRAM cells.

In some embodiments, the semiconductor structure further includes a pad-out interconnect layer above the third semiconductor layer. In some embodiments, the third semiconductor layer includes single-crystal silicon.

In some embodiments, the first semiconductor structure further includes a peripheral circuit of the array of NAND memory cells. In some embodiments, the second semiconductor structure further includes a peripheral circuit of the array of DRAM cells. In some embodiments, the third semiconductor structure further includes a peripheral circuit of at least one of the array of NAND memory cells or the array of DRAM cells.

In some embodiments, the first semiconductor structure includes a first interconnect layer vertically between the first bonding layer and the array of NAND memory cells, the second semiconductor structure includes a second interconnect layer vertically between the second bonding layer and the array of DRAM cells, and the third semiconductor structure includes a third interconnect layer vertically between the third bonding layer and the processor.

In some embodiments, the processor and the array of SRAM cells are electrically connected to the array of NAND memory cells through the first and third interconnect layers, the first bonding contacts, and the first set of the third bonding contacts, and the processor and the array of SRAM cells are electrically connected to the array of DRAM cells through the second and third interconnect layers, the second bonding contacts, and the second set of the third bonding contacts.

In some embodiments, the array of NAND memory cells are electrically connected to the array of DRAM cells through the first, second, and third interconnect layers and the first, second, and third bonding contacts.

In some embodiments, the array of SRAM cells are distributed in a plurality of separate regions in the third semiconductor structure.

According to another aspect of the present disclosure, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a processor, an array of SRAM cells, and a third bonding layer including a plurality of third bonding contacts. The third wafer is diced into a plurality of third dies, such that at least one of the third dies includes the at least one of the third semiconductor structures. The third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface.

In some embodiments, to form the plurality of first semiconductor structures, the array of NAND memory cells is formed on the first wafer, a first interconnect layer is formed above the array of NAND memory cells, and the first bonding layer is formed above the first interconnect layer. In some embodiments, to form the plurality of first semiconductor structures, a peripheral circuit of the array of NAND memory cells is formed on the first wafer.

In some embodiments, to form the plurality of second semiconductor structures, the array of DRAM cells is formed on the second wafer, a second interconnect layer is formed above the array of DRAM cells, and the second bonding layer is formed above the second interconnect layer. In some embodiments, to form the plurality of second semiconductor structures, a peripheral circuit of the array of DRAM cells is formed on the second wafer.

In some embodiments, to form the plurality of third semiconductor structures, the processor and the array of SRAM cells are formed on the third wafer, a third interconnect layer is formed above the processor and the array of SRAM cells, and the third bonding layer is formed above the third interconnect layer. In some embodiments, to form the plurality of third semiconductor structures, a peripheral circuit of at least one of the array of NAND memory cells or the array of DRAM cells is formed on the third wafer.

In some embodiments, the third semiconductor structure is above the first semiconductor structure and the second semiconductor structure after the bonding. In some embodiments, the third wafer is thinned to form a semiconductor layer after the bonding, and a pad-out interconnect layer is formed above the semiconductor layer.

In some embodiments, the third semiconductor structure is below the first semiconductor structure and the second semiconductor structure after the bonding. In some embodiments, the first wafer and the second wafer are thinned to form a first semiconductor layer and a second semiconductor layer, respectively, after the bonding, and a first pad-out interconnect layer and a second pad-out interconnect layer are formed above the first semiconductor layer and the second semiconductor layer, respectively.

In some embodiments, the bonding includes hybrid bonding.

According to still another aspect of the present disclosure, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a processor, an array of SRAM cells, and a third bonding layer including a plurality of third bonding contacts. The third wafer and each of the at least one first die and the at least one second die are bonded in a face-to-face manner to form a bonded structure, such that the at least one third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface. The bonded structure is diced into a plurality of dies. At least one of the dies includes the bonded first, second, and third semiconductor structures.

In some embodiments, to form the plurality of first semiconductor structures, the array of NAND memory cells is formed on the first wafer, a first interconnect layer is formed above the array of NAND memory cells, and the first bonding layer is formed above the first interconnect layer. In some embodiments, to form the plurality of first semiconductor structures, a peripheral circuit of the array of NAND memory cells is formed on the first wafer.

In some embodiments, to form the plurality of second semiconductor structures, the array of DRAM cells is formed on the second wafer, a second interconnect layer is formed above the array of DRAM cells, and the second bonding layer is formed above the second interconnect layer. In some embodiments, to form the plurality of second semiconductor structures, a peripheral circuit of the array of DRAM cells is formed on the second wafer.

In some embodiments, to form the plurality of third semiconductor structures, the processor and the array of SRAM cells are formed on the third wafer, a third interconnect layer is formed above the processor and the array of SRAM cells, and the third bonding layer is formed above the third interconnect layer. In some embodiments, to form the plurality of third semiconductor structures, a peripheral circuit of at least one of the array of NAND memory cells or the array of DRAM cells is formed on the third wafer.

In some embodiments, the third semiconductor structure is above the first semiconductor structure and the second semiconductor structure after the bonding. In some embodiments, the third wafer is thinned to form a semiconductor layer after the bonding, and a pad-out interconnect layer is formed above the semiconductor layer.

In some embodiments, the third semiconductor structure is below the first semiconductor structure and the second semiconductor structure after the bonding. In some embodiments, the first wafer and the second wafer are thinned to form a first semiconductor layer and a second semiconductor layer, respectively, after the bonding, and a first pad-out interconnect layer and a second pad-out interconnect layer are formed above the first semiconductor layer and the second semiconductor layer, respectively.

In some embodiments, the bonding includes hybrid bonding.

According to yet another aspect of the present disclosure, a semiconductor device in a multi-chip package (MCP) includes a circuit board, a hybrid controller on the circuit board, at least one NAND die, and at least one DRAM die. The at least one NAND die includes an array of NAND memory cells and is electrically connected to the hybrid controller through die-to-die wire bonding. The at least one DRAM die includes an array of DRAM cells and is electrically connected to the hybrid controller through die-to-die wire bonding. The hybrid controller is configured to control data transfer between the at least one NAND die and the at least one DRAM die.

In some embodiments, the semiconductor device further includes at least one hybrid memory die including an array of NAND memory cells and an array of DRAM cells and electrically connected to the hybrid controller through die-to-die wire bonding.

In some embodiments, the at least one NAND die is configured to store a logical-physical address map, and the hybrid controller is configured to load the logical-physical address map from the at least one NAND die to the at least one DRAM die when the semiconductor device is powered on.

In some embodiments, the hybrid controller includes an array of SRAM cells configured to store a log of updates to the logical-physical address map.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device in a multi-chip package (MCP), comprising:
   a controller comprising a processor on a substrate and an array of static random-access memory (SRAM) cells on the substrate and outside of the processor;
   at least one non-volatile memory die comprising an array of non-volatile memory cells and connected to the controller through wire bonding;
   at least one volatile memory die comprising an array of volatile memory cells and connected to the controller through wire bonding; and
   at least one control and sensing circuit on the substrate and outside the processor, and configured to control at least one of the array of non-volatile memory cells or the array of volatile memory cells,
   wherein the controller is configured to control operations of the at least one non-volatile memory die and the at least one volatile memory die,
   wherein the at least one control and sensing circuit comprises a first control and sensing circuit configured to control the array of volatile memory cells, and
   wherein the first control and sensing circuit comprises at least one of a row decoder or a column decoder.

2. The semiconductor device of claim 1, wherein the controller is configured to control data transmission between the at least one non-volatile memory die and the at least one volatile memory die.

3. The semiconductor device of claim 1, wherein
   the at least one non-volatile memory die is NAND die, and the array of non-volatile memory cells includes an array of NAND memory cells; and
   the at least one volatile memory die is dynamic random-access memory (DRAM) die, and the array of volatile memory cells includes an array of DRAM cells.

4. The semiconductor device of claim 3, wherein
   the NAND die is configured to store a logical-physical address map; and
   the controller is configured to load the logical-physical address map from the NAND die to the DRAM die when the semiconductor device is powered on.

5. The semiconductor device of claim 1, further comprising:
   at least one predetermined memory die comprising an array of NAND memory cells and an array of DRAM cells and electrically connected to the controller through wire bonding.

6. The semiconductor device of claim 5, further comprising:
a circuit board connected with the controller, wherein at least one predetermined memory die is stacked on the circuit board.

7. The semiconductor device of claim 1, wherein a log of updates to a logical-physical address map is stored in the array of SRAM cells.

8. The semiconductor device of claim 1, wherein the controller comprises one or more bus interface units configured to receive and transmit data.

9. The semiconductor device of claim 1, wherein the array of non-volatile memory cells and the array of volatile memory cells are respectively above the controller.

10. The semiconductor device of claim 1, wherein the at least one control and sensing circuit comprises a second control and sensing circuit configured to control the array of non-volatile memory cells.

11. The semiconductor device of claim 10, wherein the second control and sensing circuit comprises at least one of a page buffer, a decoder, a sense amplifier, or a driver.

12. The semiconductor device of claim 1, wherein the array of SRAM cells is distributed in a plurality of separate regions outside the processor.

13. The semiconductor device of claim 3, wherein the controller acts as a NAND memory controller managing data storage and transfer in the NAND die.

14. The semiconductor device of claim 3, wherein the controller acts as a DRAM controller managing data storage and transfer in the DRAM die.

15. The semiconductor device of claim 4, wherein the logical-physical address map is configured to map a physical address to a logical address.

* * * * *